US012812906B2

(12) United States Patent
Hsueh et al.

(10) Patent No.: US 12,812,906 B2
(45) Date of Patent: Nov. 24, 2026

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Ching Hwan Hsueh, New Taipei (TW); Kung-Cheng Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 381 days.

(21) Appl. No.: 18/512,450

(22) Filed: Nov. 17, 2023

(65) Prior Publication Data

US 2025/0169107 A1 May 22, 2025

(51) Int. Cl.

| | |
|---|---|
| ***H10D 30/67*** | (2025.01) |
| ***H10D 30/01*** | (2025.01) |
| ***H10D 30/43*** | (2025.01) |
| ***H10D 62/10*** | (2025.01) |
| ***H10D 64/01*** | (2025.01) |
| ***H10D 84/01*** | (2025.01) |

(Continued)

(52) U.S. Cl.

CPC ....... *H10D 30/6729* (2025.01); *H10D 30/014* (2025.01); *H10D 30/43* (2025.01); *H10D 30/6735* (2025.01); *H10D 30/6757* (2025.01); *H10D 62/121* (2025.01); *H10D 64/017* (2025.01); *H10D 84/017* (2025.01); *H10D 84/038* (2025.01); *H10D 84/85* (2025.01)

(58) Field of Classification Search

CPC .. H10D 30/014; H10D 30/43; H10D 30/6729; H10D 30/6735; H10D 30/6757; H10D 62/121; H10D 62/151; H10D 64/017; H10D 84/013; H10D 84/0133; H10D 84/0149; H10D 84/017; H10D 84/038; H10D 84/83; H10D 84/85

See application file for complete search history.

(56) References Cited

U.S. PATENT DOCUMENTS 9,209,247 B2 12/2015 Colinge et al.
9,236,267 B2 1/2016 De et al.

(Continued)

FOREIGN PATENT DOCUMENTS

TW 429457 B 4/2001
TW 201642464 A 12/2016

(Continued)

*Primary Examiner* — Britt Hanley
*Assistant Examiner* — Kevin Quinto
(74) *Attorney, Agent, or Firm* — NZ Carr Law Office

(57) ABSTRACT

Embodiments of the present disclosure provide semiconductor device structures and methods of forming the same. The structure includes a first plurality of source/drain regions disposed along a first direction, a second plurality of source/drain regions disposed along the first direction and spaced apart from the first plurality of source/drain regions, a conductive feature disposed between the first and second pluralities of source/drain regions, and a plurality of conductive contacts disposed over and in contact with the conductive feature. Each conductive contact of the plurality of conductive contacts is in contact with a source/drain region of the first plurality of source/drain regions and a source/drain region of the second plurality of source/drain regions.

20 Claims, 26 Drawing Sheets

(51) Int. Cl.

| | |
|---|---|
| ***H10D 84/03*** | (2025.01) |
| ***H10D 84/85*** | (2025.01) |

(56) References Cited

U.S. PATENT DOCUMENTS

| | | | | |
|---|---|---|---|---|
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 2020/0373331 | A1* | 11/2020 | Kim ..................... | H10D 86/215 |
| 2021/0391224 | A1 | 12/2021 | Wu et al. | |
| 2022/0028895 | A1 | 1/2022 | Kim et al. | |
| 2022/0415828 | A1 | 12/2022 | Lee et al. | |
| 2023/0007879 | A1 | 1/2023 | Zhang | |

FOREIGN PATENT DOCUMENTS

| | | | |
|---|---|---|---|
| TW | 202002240 | A | 1/2020 |
| TW | 202042291 | A | 11/2020 |
| TW | 202137555 | A | 10/2021 |
| TW | 202209580 | A | 3/2022 |
| TW | 202320325 | A | 5/2023 |

* cited by examiner

SEMICONDUCTOR DEVICE STRUCTURE AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Therefore, there is a need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-8A are cross-sectional side views of various stages of manufacturing the semiconductor device structure taken along line A-A of FIG. 1, in accordance with some embodiments.

FIGS. 3B-8B are cross-sectional side views of various stages of manufacturing the semiconductor device structure taken along line B-B of FIG. 1, in accordance with some embodiments.

FIGS. 9A-13A are cross-sectional side views of various stages of manufacturing the semiconductor device structure taken along line A-A of FIG. 1, in accordance with some embodiments.

FIGS. 9B-13B are cross-sectional side views of various stages of manufacturing the semiconductor device structure taken along line C-C of FIG. 8B, in accordance with some embodiments.

FIGS. 16A-19A are top views of various stages of manufacturing the semiconductor device structure after the semiconductor device structure is flipped over, in accordance with some embodiments.

FIGS. 16B-19B are cross-sectional side views of various stages of manufacturing the semiconductor device structure taken along line A-A of FIG. 1, in accordance with some embodiments.

FIGS. 16C-19C are cross-sectional side views of various stages of manufacturing the semiconductor device structure taken along line C-C of FIG. 8B, in accordance with some embodiments.

DETAILED DESCRIPTION

Figure 1:
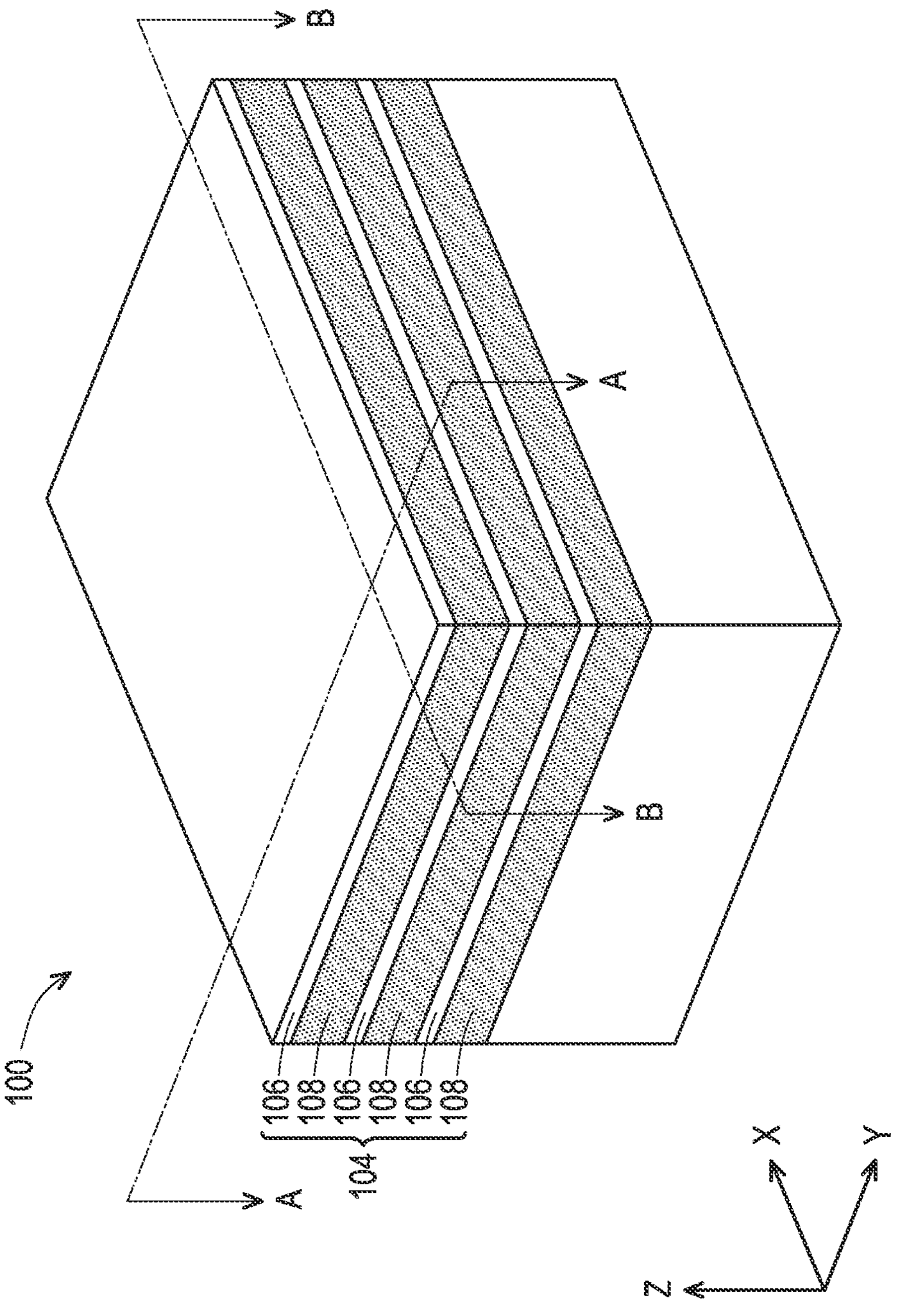
FIG. 1 is a perspective view of one of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

While the embodiments of this disclosure are discussed with respect to nanostructure channel FETs, implementations of some aspects of the present disclosure may be used in other processes and/or in other devices, such as planar FETs, FinFETs, Horizontal Gate All Around (HGAA) FETs, Vertical Gate All Around (VGAA) FETs, nanosheet FETs, nanowire FETs, forksheet FETs, complementary FETs (CFETs), and other suitable devices. A person having ordinary skill in the art will readily understand other modifications that may be made are contemplated within the scope of this disclosure. In cases where gate all around (GAA) transistor structures are adapted, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1-19C show exemplary processes for manufacturing a semiconductor device structure 100 according to embodiments of the present disclosure. It is understood that additional operations can be provided before, during, and after processes shown by FIGS. 1-19C, and some of the operations described below can be replaced or eliminated, for additional embodiments of the method. The order of the operations/processes is not limiting and may be interchangeable.

FIG. 1 is a perspective view of one of various stages of manufacturing a semiconductor device structure 100, in accordance with some embodiments. As shown in FIG. 1, a semiconductor device structure 100 includes a stack of semiconductor layers 104 formed over a substrate 101. The substrate 101 may be a semiconductor substrate. The substrate 101 may include a crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In some embodiments, the substrate 101 is a silicon-on-insulator (SOI) substrate having an insulating layer (not shown) disposed between two silicon layers for enhancement. In one aspect, the insulating layer is an oxygen-containing layer.

The substrate 101 may include various regions that have been doped with impurities (e.g., dopants having p-type or n-type impurities). Depending on circuit design, the dopants may be, for example phosphorus for an n-type field effect transistors (NFET) and boron for a p-type field effect transistors (PFET).

The stack of semiconductor layers 104 includes alternating semiconductor layers made of different materials to facilitate formation of nanostructure channels in a multi-gate device, such as nanostructure channel FETs. In some embodiments, the stack of semiconductor layers 104 includes first semiconductor layers 106 and second semiconductor layers 108. In some embodiments, the stack of semiconductor layers 104 includes alternating first and second semiconductor layers 106, 108. The first semiconductor layers 106 and the second semiconductor layers 108 are made of semiconductor materials having different etch selectivity and/or oxidation rates. For example, the first semiconductor layers 106 may be made of Si and the second semiconductor layers 108 may be made of SiGe. In some examples, the first semiconductor layers 106 may be made of SiGe and the second semiconductor layers 108 may be made of Si. Alternatively, in some embodiments, either of the semiconductor layers 106, 108 may be or include other materials such as Ge, SiC, GeAs, GaP, InP, InAs, InSb, GaAsP, AlInAs, AlGaAs, InGaAs, GaInP, GaInAsP, or any combinations thereof.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes.

The first semiconductor layers 106 or portions thereof may form nanostructure channel(s) of the semiconductor device structure 100 in later fabrication stages. The term nanostructure is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including, for example, a cylindrical in shape or substantially rectangular cross-section. The nanostructure channel(s) of the semiconductor device structure 100 may be surrounded by a gate electrode. The semiconductor device structure 100 may include a nanostructure transistor. The nanostructure transistors may be referred to as nanosheet transistors, nanowire transistors, gate-all-around (GAA) transistors, multi-bridge channel (MBC) transistors, or any transistors having the gate electrode surrounding the channels. The use of the first semiconductor layers 106 to define a channel or channels of the semiconductor device structure 100 is further discussed below.

Each first semiconductor layer 106 may have a thickness in a range between about 5 nm and about 30 nm. Each second semiconductor layer 108 may have a thickness that is equal, less, or greater than the thickness of the first semiconductor layer 106. In some embodiments, each second semiconductor layer 108 has a thickness in a range between about 2 nm and about 50 nm. Three first semiconductor layers 106 and three second semiconductor layers 108 are alternately arranged as illustrated in FIG. 1, which is for illustrative purposes and not intended to be limiting beyond what is specifically recited in the claims. It can be appreciated that any number of first and second semiconductor layers 106, 108 can be formed in the stack of semiconductor layers 104, and the number of layers depending on the predetermined number of channels for the semiconductor device structure 100.

Figure 2B:
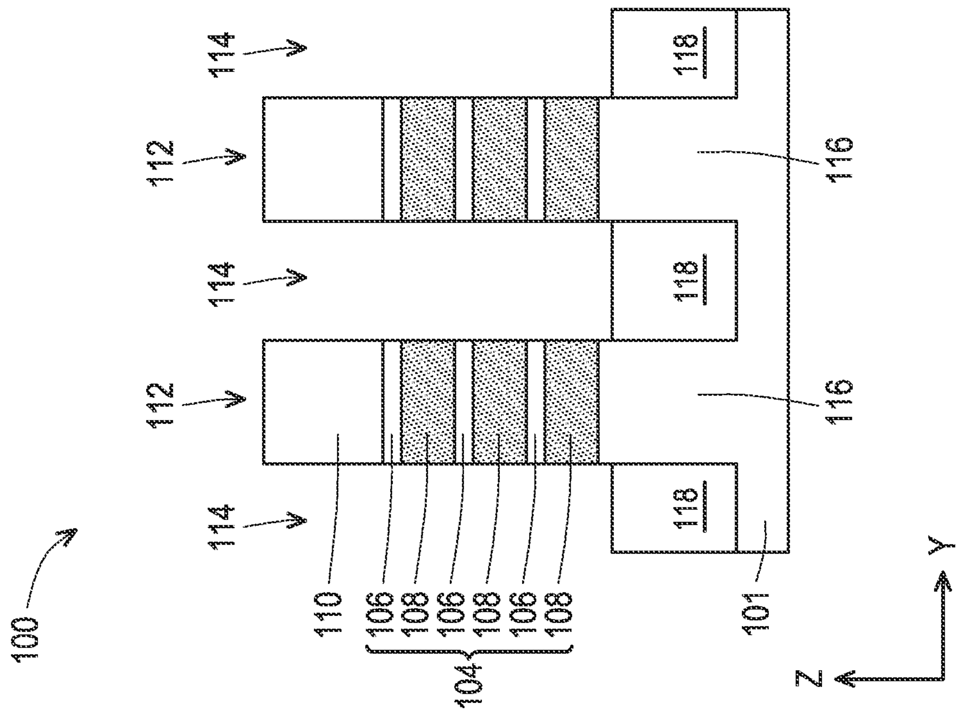
FIGS. 2A-2D are cross-sectional side views of various stages of manufacturing the semiconductor device structure taken along line A-A of FIG. 1, in accordance with some embodiments.
Figure 2A:
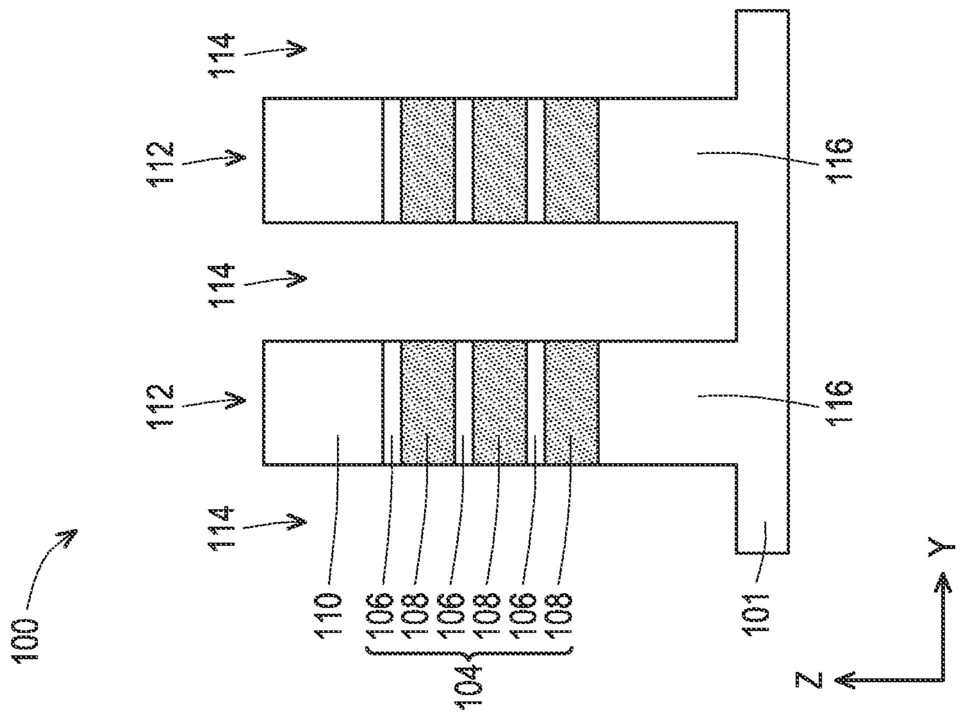

FIGS. 2A-2D are cross-sectional side views of various stages of manufacturing the semiconductor device structure 100 taken along line A-A of FIG. 1, in accordance with some embodiments. As shown in FIG. 2A, fin structures 112 are formed from the stack of semiconductor layers 104. Each fin structure 112 has an upper portion including the semiconductor layers 106, 108 and a well portion 116 formed from the substrate 101. The fin structures 112 may be formed by patterning a hard mask layer 110 formed on the stack of semiconductor layers 104 using multi-patterning operations including photo-lithography and etching processes. The etching process can include dry etching, wet etching, reactive ion etching (RIE), and/or other suitable processes. The photo-lithography process may include forming a photoresist layer (not shown) over the hard mask layer 110, exposing the photoresist layer to a pattern, performing post-exposure bake processes, and developing the photoresist layer to form a masking element including the photoresist layer. In some embodiments, patterning the photoresist layer to form the masking element may be performed using an electron beam (e-beam) lithography process. The etching process forms trenches 114 in unprotected regions through the hard mask layer 110, through the stack of semiconductor layers 104, and into the substrate 101, thereby leaving the plurality of extending fin structures 112. The trenches 114 extend along the X direction. The trenches 114 may be etched using a dry etch (e.g., RIE), a wet etch, and/or combination thereof.

In FIG. 2B, after the fin structures 112 are formed, isolation regions 118 are formed on the substrate 101. The isolation regions 118 may be formed by first filling the trenches 114 between neighboring fin structures 112 with an insulating material. The insulating material is then recessed to form isolation regions 118. The recess of the insulating material exposes portions of the fin structures 112, such as the stack of semiconductor layers 104. The recess of the insulating material reveals the trenches 114 between the neighboring fin structures 112. A top surface of the isolation region 118 may be level with or below a surface of the second semiconductor layers 108 in contact with the well portion 116 formed from the substrate 101. The isolation regions 118 may be made of silicon oxide, silicon nitride, silicon oxynitride (SiON), SiOCN, SiCN, fluorine-doped silicate glass (FSG), a low-K dielectric material, or any suitable dielectric material. The isolation regions 118 may be formed by any suitable method, such as low-pressure chemical vapor deposition (LPCVD), plasma enhanced CVD (PECVD) or flowable CVD (FCVD).

Figure 2D:
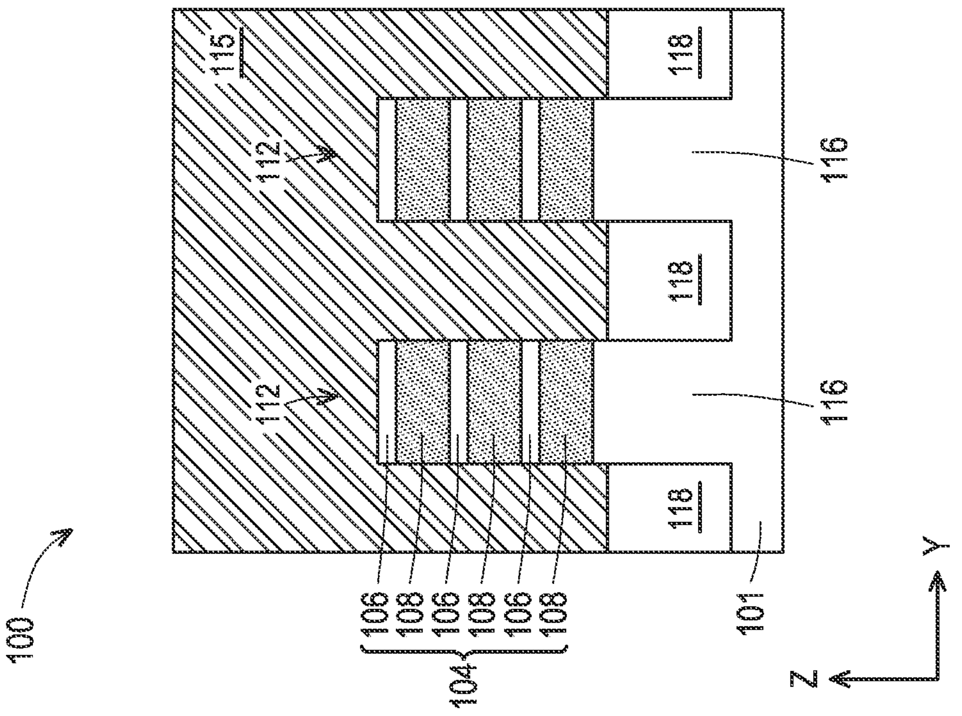
Figure 2C:
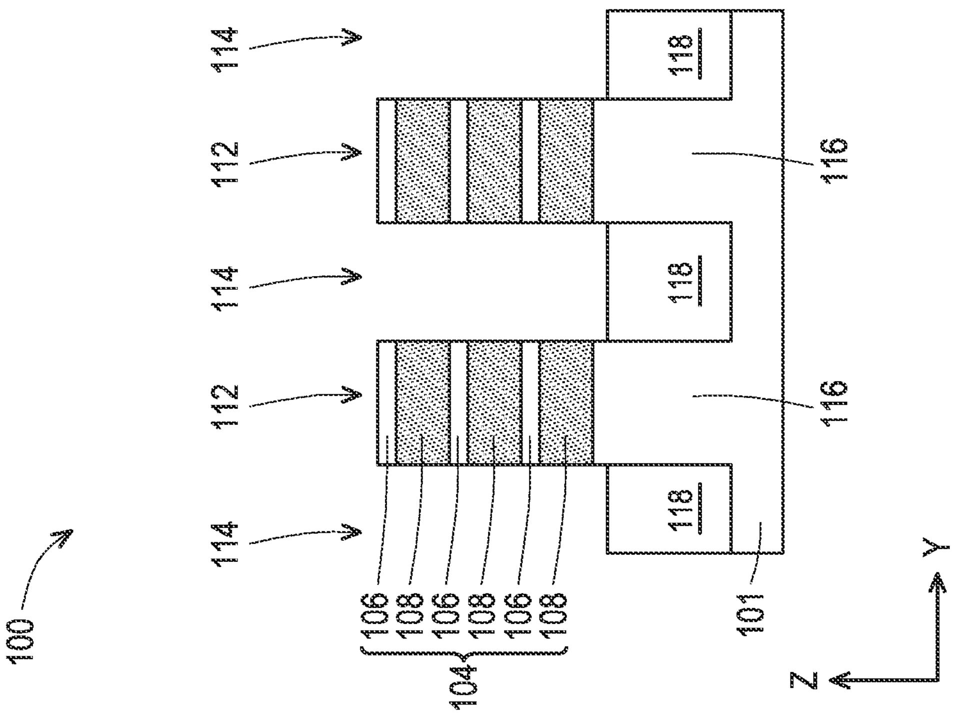

As shown in FIG. 2C, the hard mask layer 110 is removed. The hard mask layer 110 may be removed by a selective etch process that does not substantially affect the isolation regions 118 and the stack of semiconductor layers 104. As shown in FIG. 2D, a sacrificial gate material 115 is formed on the fin structures 112 and the isolation regions 118. A sacrificial gate dielectric layer (not shown) may be first formed on the fin structures 112 and the isolation regions 118, and the sacrificial gate material 115 is formed on the sacrificial gate dielectric layer.

Figure 3A:
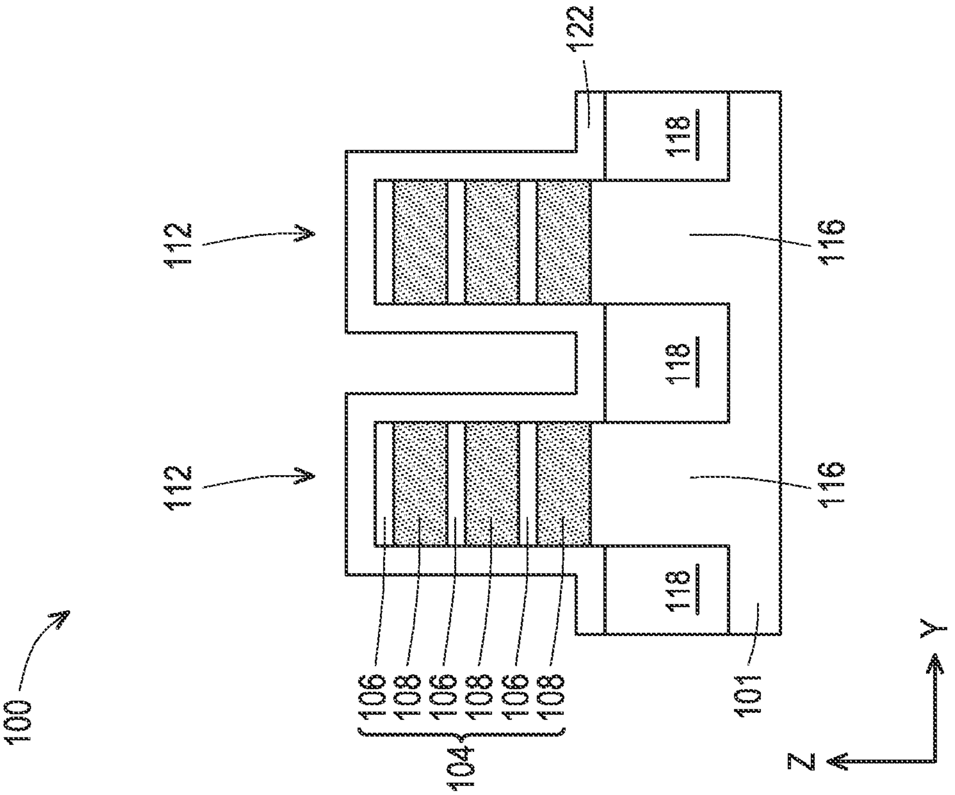

FIGS. 3A-8A are cross-sectional side views of various stages of manufacturing the semiconductor device structure 100 taken along line A-A of FIG. 1, in accordance with some embodiments. The line A-A illustrates a cross-section in the source/drain (S/D) regions. FIGS. 3B-8B are cross-sectional side views of various stages of manufacturing the semiconductor device structure 100 taken along line B-B of FIG. 1, in accordance with some embodiments. The line B-B illustrates a cross-section along a fin structure 112. As shown in FIGS. 3A and 3B, the one or more sacrificial gate electrodes 120 (only one is shown) are formed across one or more fin structures 112. The one or more sacrificial gate electrodes 120 may be formed by patterning the sacrificial gate material 115. The sacrificial gate dielectric layer may be also patterned along with the sacrificial gate material 115. In some embodiments, the sacrificial gate electrode 120 and the sacrificial gate dielectric layer together may form a sacrificial gate structure. Each sacrificial gate structure may be formed over a portion of the fin structures 112. While one sacrificial gate structure is shown, two or more sacrificial gate structures may be arranged along the X direction in some embodiments.

In some embodiments, a mask layer (not shown) may be formed on the sacrificial gate electrode 120, and the mask layer is part of the sacrificial gate structure. The sacrificial gate dielectric layer may include one or more layers of dielectric material, such as a silicon oxide-based material. The sacrificial gate electrode 120 may include silicon such as polycrystalline silicon or amorphous silicon. The mask layer may include more than one layer, such as an oxide layer and a nitride layer.

Figure 3B:
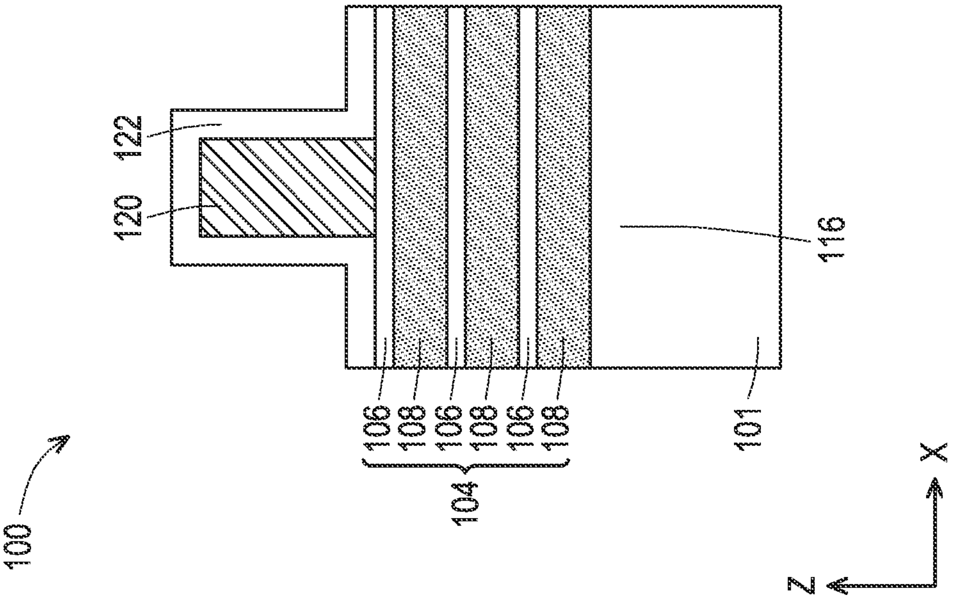

As shown in FIGS. 3A and 3B, gate spacers 122 are then formed on the sacrificial gate structures and the exposed portions of the fin structures 112. The gate spacers 122 may one or more conformal layers. The gate spacer 122 may be made of a dielectric material such as silicon oxide, silicon nitride, silicon carbide, silicon oxynitride, SiCN, silicon oxycarbide, SiOCN, and/or combinations thereof.

Figure 4B:
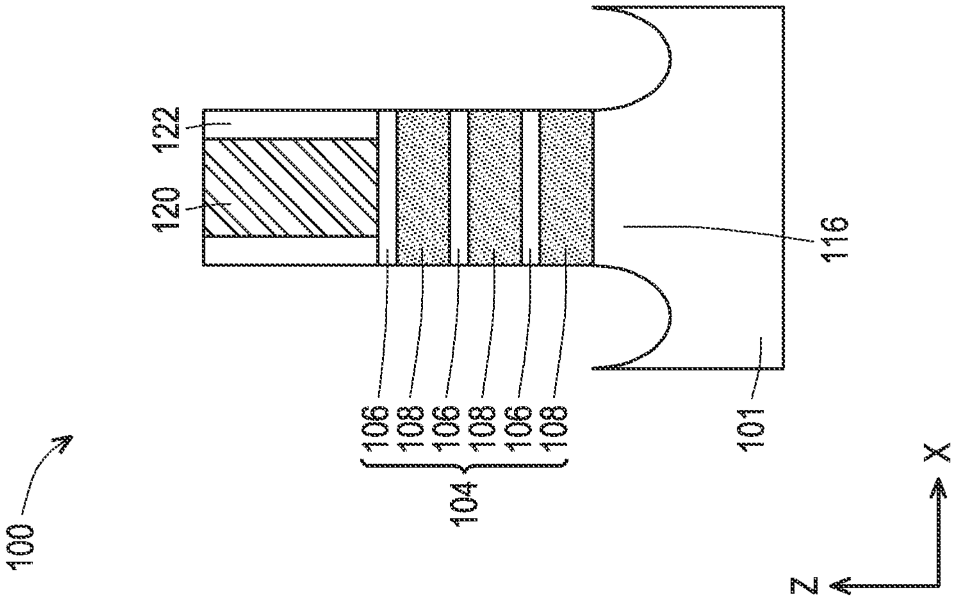
Figure 4A:
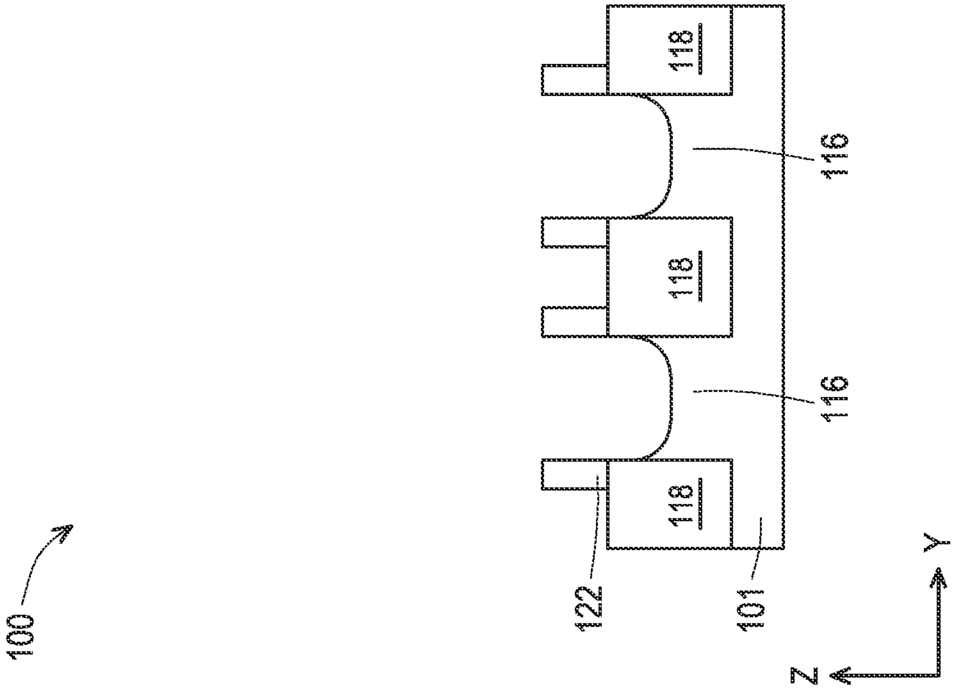

Next, as shown in FIGS. 4A and 4B, an anisotropic etch process is performed to remove portions of the gate spacers 122 formed on horizontal surfaces, and the exposed portions of the fin structures 112 not covered by the sacrificial gate structures are recessed. The portions of the fin structures 112 that are covered by the sacrificial gate electrode 120 of the sacrificial gate structure serve as channel regions for the semiconductor device structure 100.

The portions of the fin structures 112 not covered by the sacrificial gate structure and the gate spacers 122 are recessed to a level above, at, or below the top surfaces of the isolation regions 118. The recess of the portions of the fin structures 112 can be done by an etch process, either isotropic or anisotropic etch process, and the etch process may be selective with respect to one or more crystalline planes of the substrate 101. The etch process may be a dry etch, such as a RIE, NBE, or the like, or a wet etch, such as using tetramethyalammonium hydroxide (TMAH), ammonium hydroxide ($NH_4OH$), or any suitable etchant. After recessing the exposed portion of each fin structure 112, a portion of each well portion 116 is exposed.

Figure 5B:
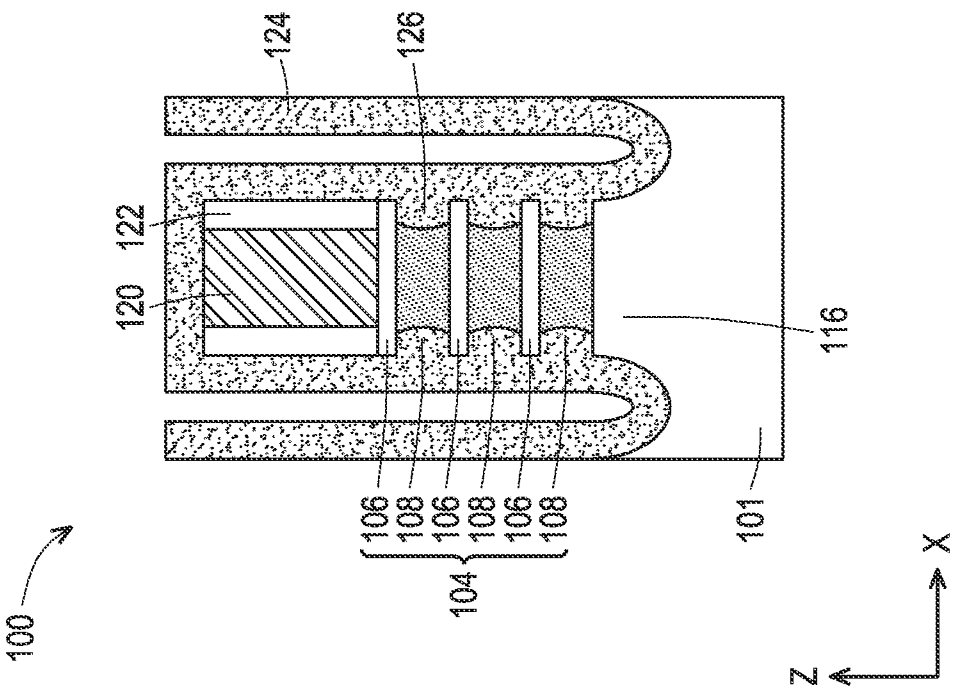
Figure 5A:
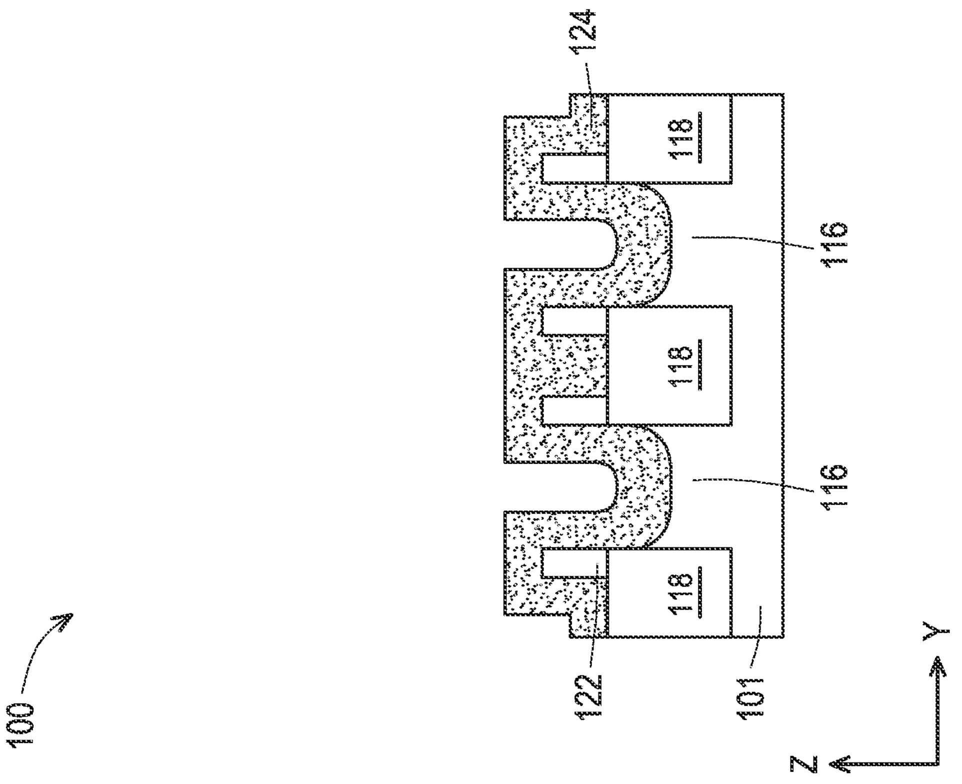

Next, as shown in FIGS. 5A and 5B, edge portions of each second semiconductor layer 108 of the stack of semiconductor layers 104 are removed horizontally along the X direction, and a dielectric layer 124 is deposited on the exposed surfaces of the semiconductor device structure 100. The removal of the edge portions of the second semiconductor layers 108 forms cavities. In some embodiments, the portions of the second semiconductor layers 108 are removed by a selective wet etch process. In cases where the second semiconductor layers 108 are made of SiGe and the first semiconductor layers 106 are made of silicon, the second semiconductor layer 108 can be selectively etched using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions.

The dielectric layer 124 may be made of a dielectric material, such as SiON, SiCN, SiOC, SiOCN, SiN, SIO2, AlO, or HfO. In some embodiments, the dielectric material is a low-K dielectric material (with K value less than 7). In some embodiments, the dielectric material is a high-K dielectric material (with K value greater than or equal to 7). The dielectric layer 124 may be formed by a conformal deposition process, such as ALD. Portions of the dielectric layer 124 formed in the cavities created by the removal of the edge portions of the second semiconductor layers 108 may be dielectric spacers 126, as shown in FIG. 5B.

Figure 6B:
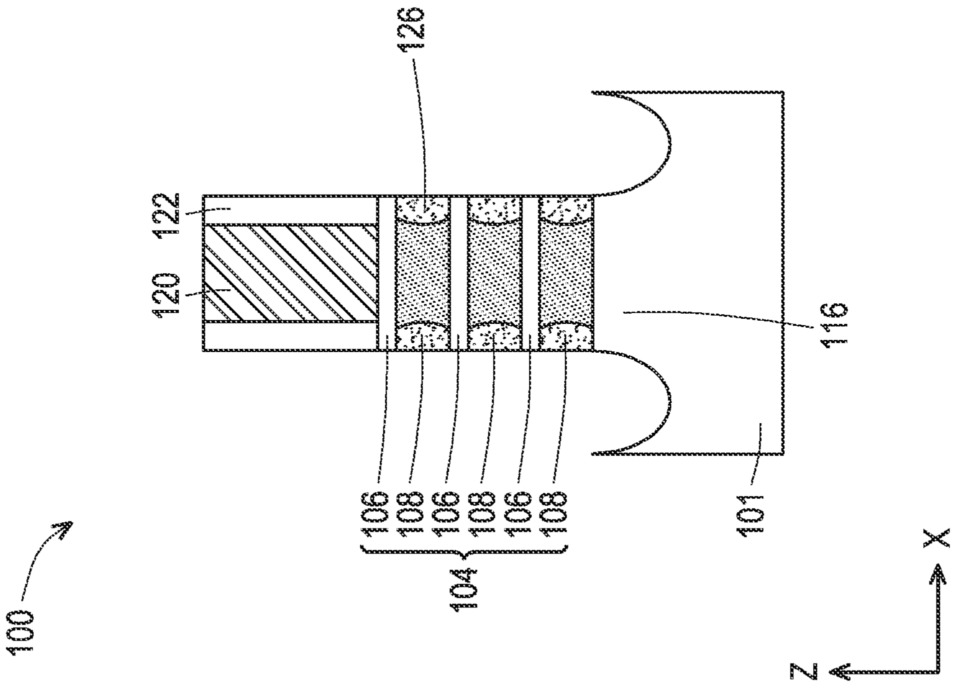
Figure 6A:
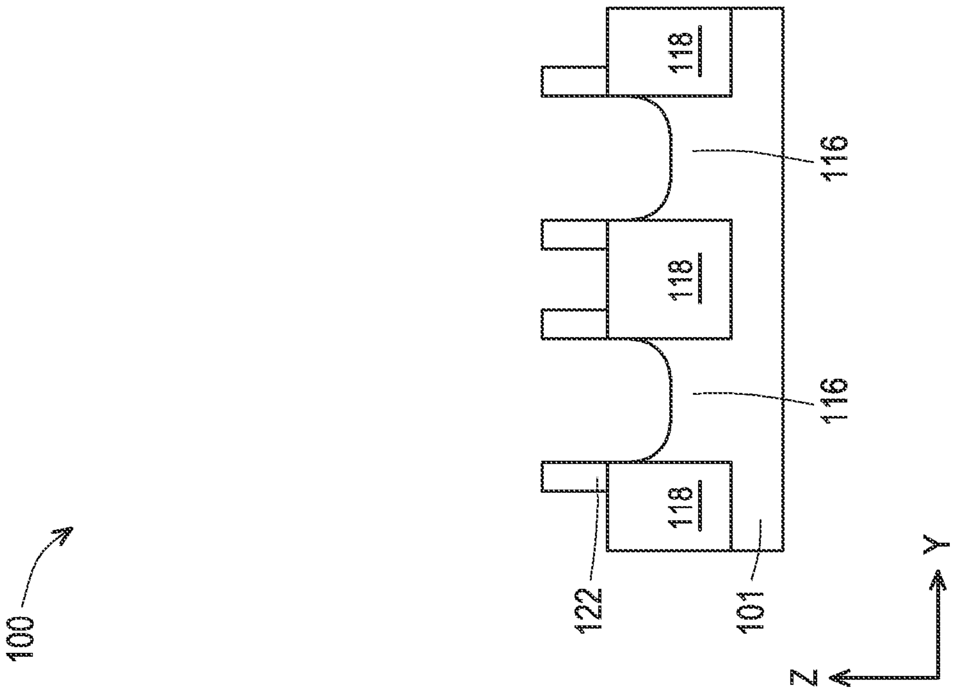

As shown in FIGS. 6A and 6B, portions of the dielectric layer 124 are removed by an anisotropic etch process. As a result, the dielectric spacers 126 are not removed because the dielectric spacers 126 are protected by the first semiconductor layers 106 during the anisotropic etch process. The remaining second semiconductor layers 108 are capped between the dielectric spacers 126 along the X direction.

Figure 7A:
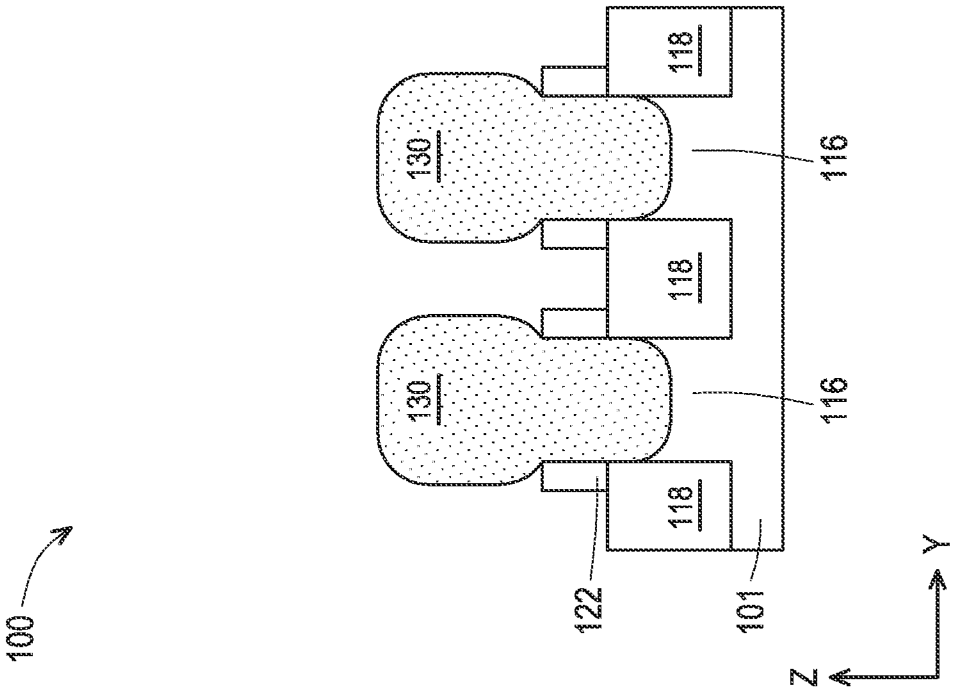
Figure 7B:
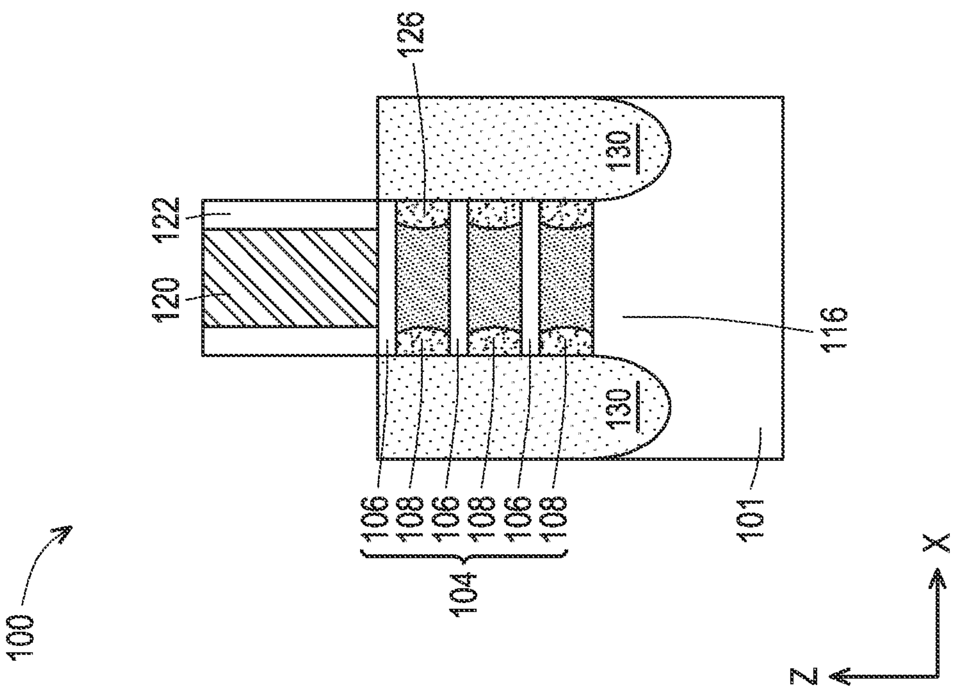

Next, as shown in FIGS. 7A and 7B, source/drain (S/D) regions 130 are formed from the well portion 116. The S/D regions 130 may grow both vertically and horizontally to form facets, which may correspond to crystalline planes of the material used for the well portion 116. In this disclosure, a source region and a drain region are interchangeably used, and the structures thereof are substantially the same. Furthermore, source/drain region(s) may refer to a source or a drain, individually or collectively dependent upon the context. The S/D regions 130 may be made of one or more layers of Si, SiP, SiC and SiCP for n-channel FETs or Si, SiGe, Ge for p-channel FETs. For p-channel FETs, p-type dopants, such as boron (B), may also be included in the S/D regions 130. The S/D regions 130 may be formed by an epitaxial growth method using CVD, ALD or MBE.

Figure 8A:
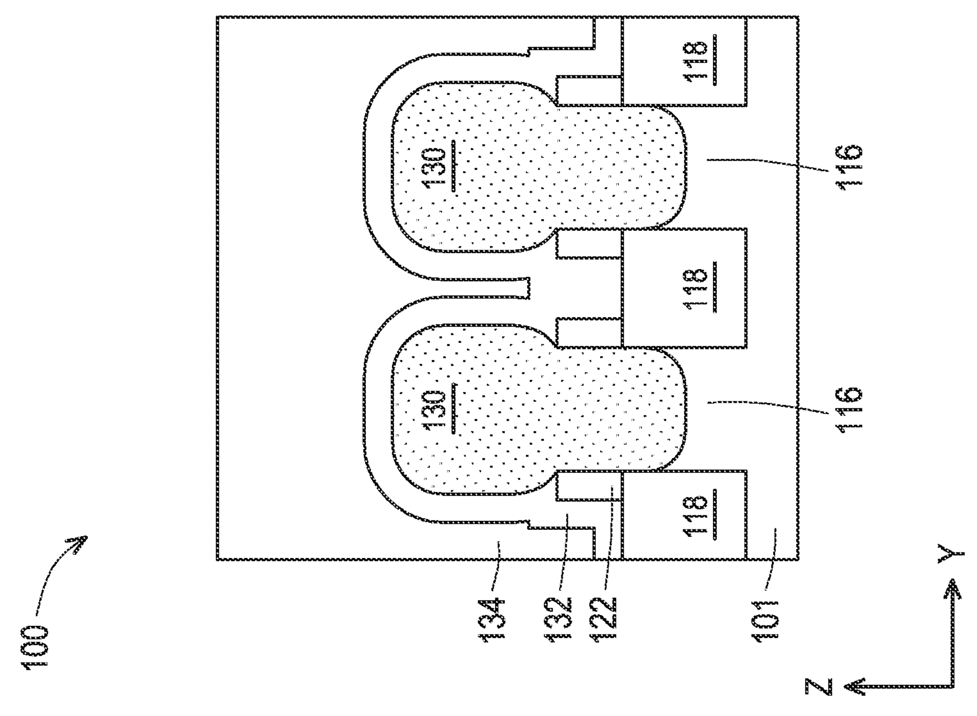
Figure 8B:
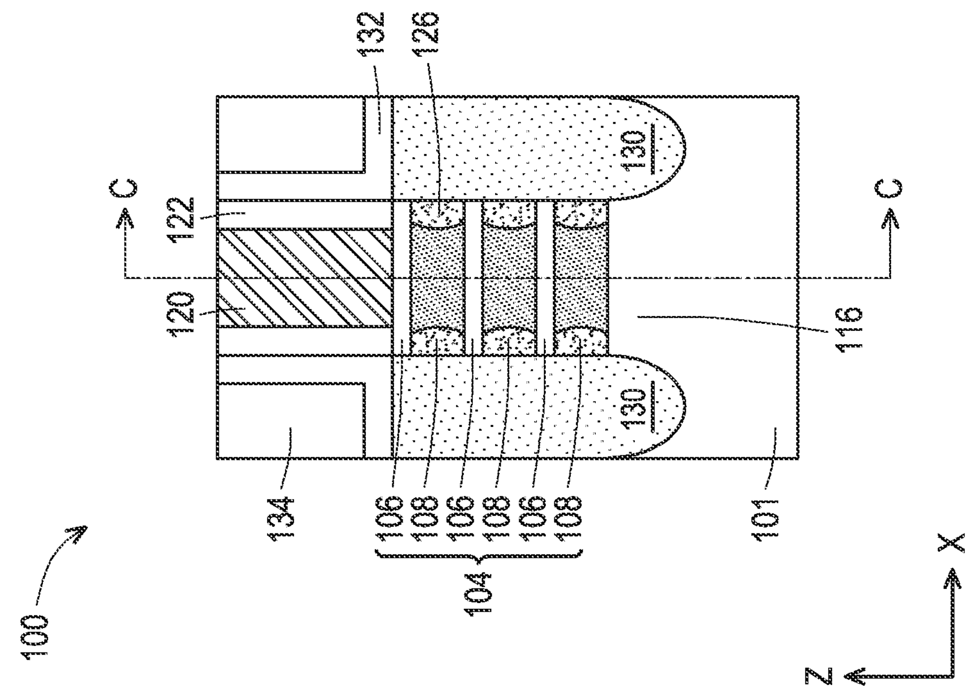

As shown in FIGS. 8A and 8B, a contact etch stop layer (CESL) 132 is conformally formed on the exposed surfaces of the semiconductor device structure 100. The CESL 132 covers the sidewalls of the sacrificial gate structure, the isolation regions 118, the S/D regions 130 and the S/D regions (not shown) that are opposite type as the S/D regions 130, and the dielectric layer 124. The CESL 132 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique. Next, an interlayer dielectric (ILD) layer 134 is formed on the CESL 132 over the semiconductor device structure 100. The materials for the ILD layer 134 may include compounds including Si, O, C, and/or H, such as silicon oxide, SiCOH, or SiOC. Organic materials, such as polymers, may also be used for the ILD layer 134. The ILD layer 134 may be deposited by a PECVD process or other suitable deposition technique. In some embodiments, after formation of the ILD layer 134, the semiconductor device structure 100 may be subject to a thermal process to anneal the ILD layer 134.

After the ILD layer 164 is formed, a planarization operation, such as CMP, is performed on the semiconductor device structure 100 until the sacrificial gate electrode 120 is exposed, as shown in FIGS. 8A and 8B.

FIGS. 9A-13A are cross-sectional side views of various stages of manufacturing the semiconductor device structure 100 taken along line A-A of FIG. 1, in accordance with some embodiments. FIGS. 9B-13B are cross-sectional side views of various stages of manufacturing the semiconductor device structure 100 taken along line C-C of FIG. 8B, in accordance with some embodiments. The line C-C of FIG. 8B illustrates a cross-section in the gate/channel region.

Figure 9B:
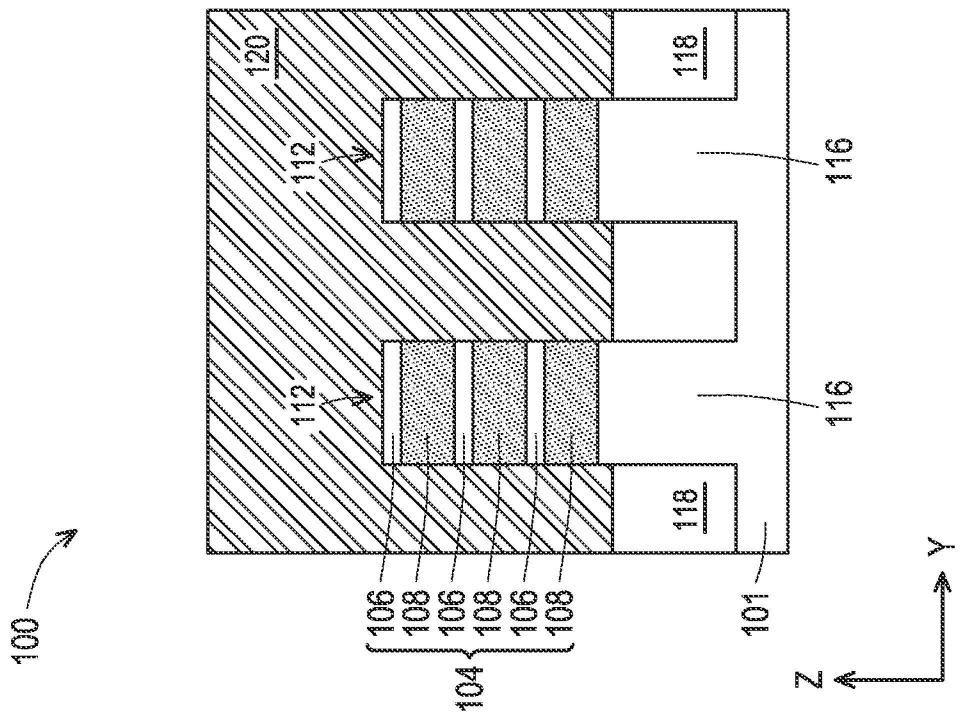
Figure 9A:
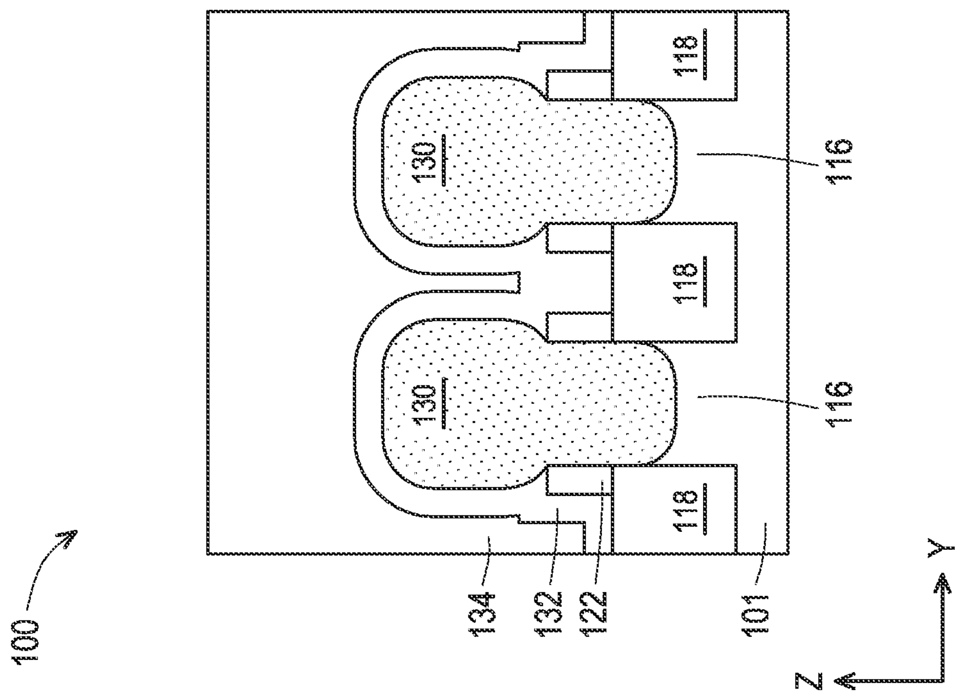
Figure 10B:
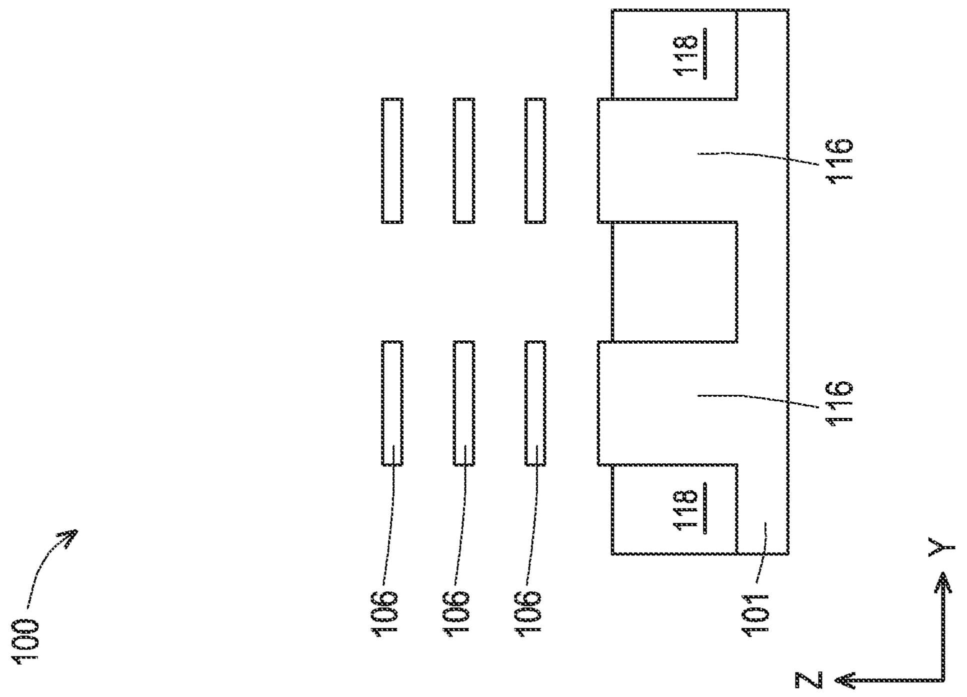
Figure 10A:
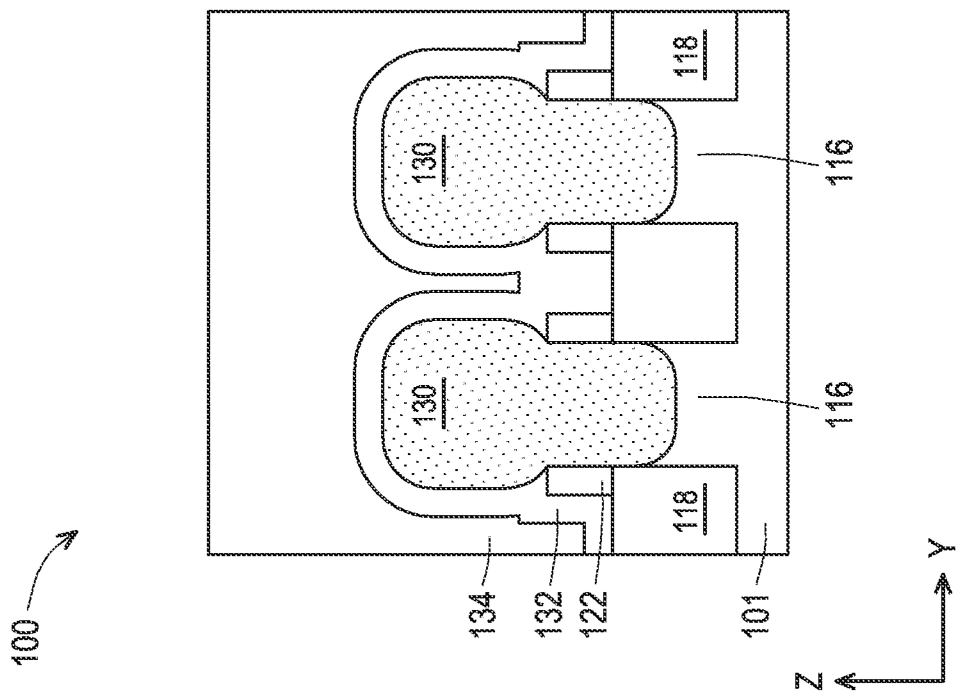
Figure 11A:
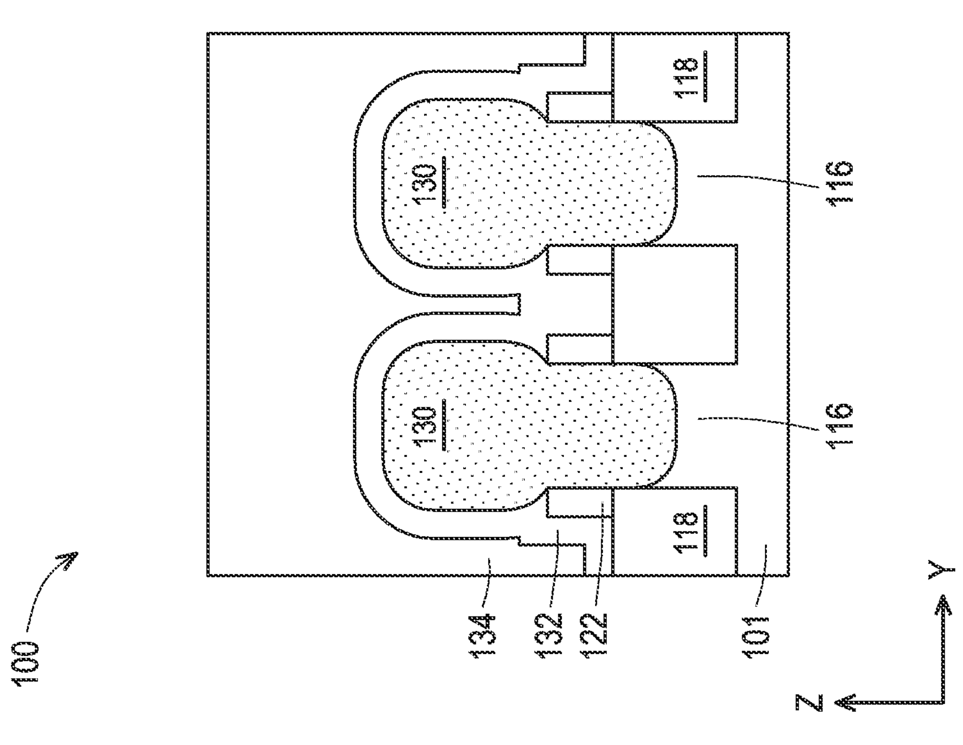
Figure 11B:
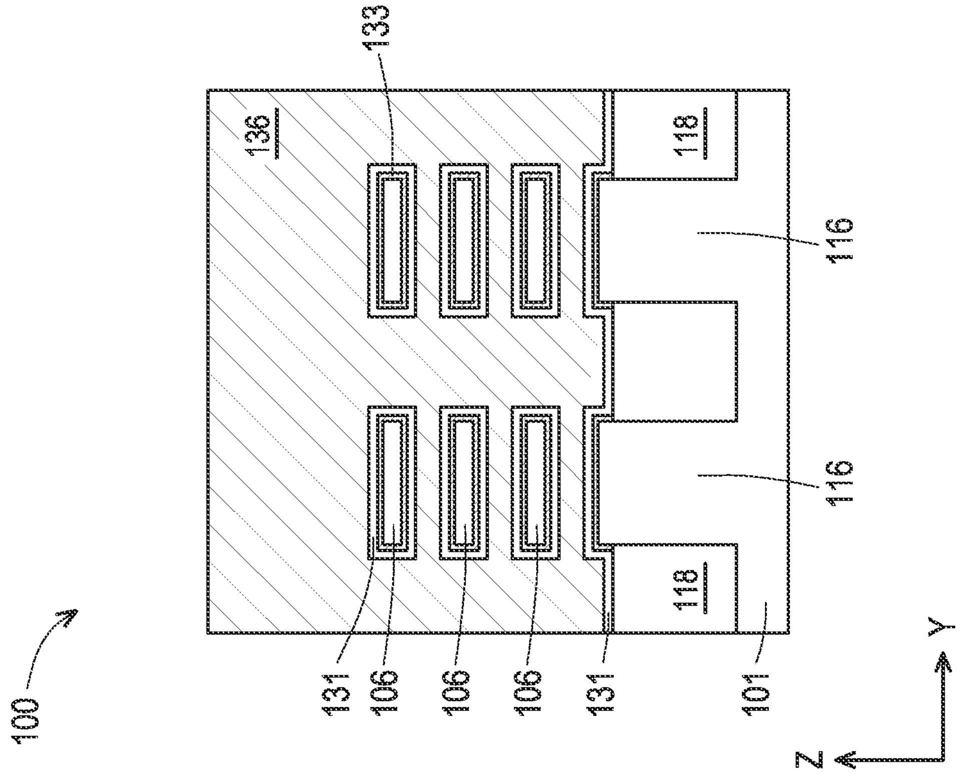

FIGS. 9A and 9B illustrates the semiconductor device structure 100 at the same stage of manufacturing as the semiconductor device structure 100 shown in FIGS. 8A and 8B. Next, as shown in FIGS. 10A and 10B, the sacrificial gate structure and the second semiconductor layers 108 are removed. The removal of the sacrificial gate structure and the semiconductor layers 108 forms an opening between gate spacers 122 and between first semiconductor layers 106. The ILD layer 134 protects the epitaxial features 130 during the removal processes. The sacrificial gate structure can be removed using plasma dry etching and/or wet etching. The sacrificial gate electrode 120 may be first removed by any suitable process, such as dry etch, wet etch, or a combination thereof, followed by the removal of the sacrificial gate dielectric layer, which may also be performed by any suitable process, such as dry etch, wet etch, or a combination thereof. In some embodiments, a wet etchant such as a tetramethylammonium hydroxide (TMAH) solution can be used to selectively remove the sacrificial gate electrode 120 but not the gate spacers 122, the ILD layer 134, and the CESL 132.

The second semiconductor layers 108 may be removed using a selective wet etching process. In cases where the second semiconductor layers 108 are made of SiGe and the first semiconductor layers 106 are made of Si, the chemistry used in the selective wet etching process removes the SiGe while not substantially affecting Si and the dielectric materials of the gate spacers 122 and the isolation regions 118. In one embodiment, the second semiconductor layers 108 can be removed using a wet etchant such as, but not limited to, hydrofluoric (HF), nitric acid ($HNO_3$), hydrochloric acid (HCl), phosphoric acid ($H_3PO_4$), a dry etchant such as fluorine-based (e.g., $F_2$) or chlorine-based gas (e.g., $Cl_2$), or any suitable isotropic etchants.

After the formation of the nanostructure channels (i.e., the exposed portions of the first semiconductor layers 106), a gate dielectric layer 131 is formed to surround the exposed portions of the first semiconductor layers 106, and a gate electrode 136 is formed on the gate dielectric layer 131. The gate dielectric layer 131 and the gate electrode 136 may be collectively referred to as a gate structure. In some embodiments, an interfacial layer (IL) 133 is formed between the gate dielectric layer 131 and the exposed surfaces of the first semiconductor layers 106. In some embodiments, the IL 133 is selectively formed on the semiconductor material of the well portion 116 and the first semiconductor layers 106, and the gate dielectric layer 131 is then formed on the IL 133 and the isolation regions 118. In some embodiments, the gate dielectric layer 131 includes one or more layers of a dielectric material, such as silicon oxide, silicon nitride, or high-K dielectric material, other suitable dielectric material, and/or combinations thereof. Examples of high-K dielectric material include $HfO_2$, HfSiO, HfSiON, HfTaO, HfTIO, HfZrO, zirconium oxide, aluminum oxide, titanium oxide, hafnium dioxide-alumina ($HfO_2$—$Al_2O_3$) alloy, other suitable high-K dielectric materials, and/or combinations thereof. The gate dielectric layer 131 may be formed by CVD, ALD or any suitable deposition technique. The gate electrode 136 may include one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or any combinations thereof. The gate electrode 136 may be formed by CVD, ALD, electro-plating, or other suitable deposition technique. The gate electrode 136 may be also deposited over the upper surface of the ILD layer 134. The gate dielectric layer 131 and the gate electrode 136 formed over the ILD layer 134 are then removed by using, for example, CMP, until the top surface of the ILD layer 134 is exposed.

Figure 12B:
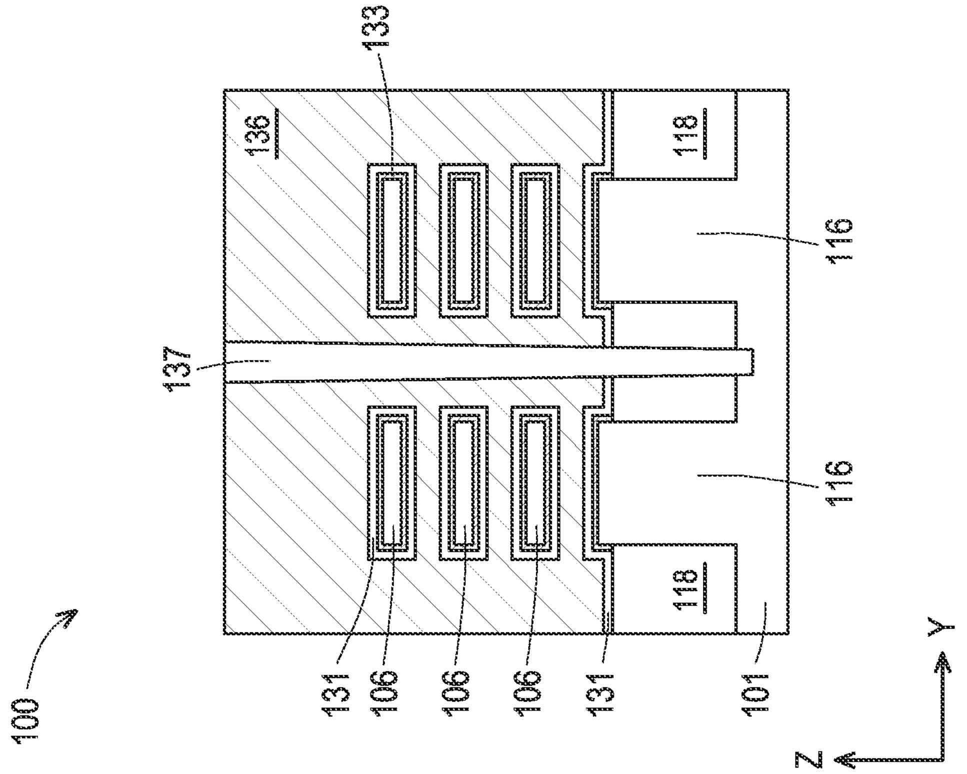
Figure 12A:
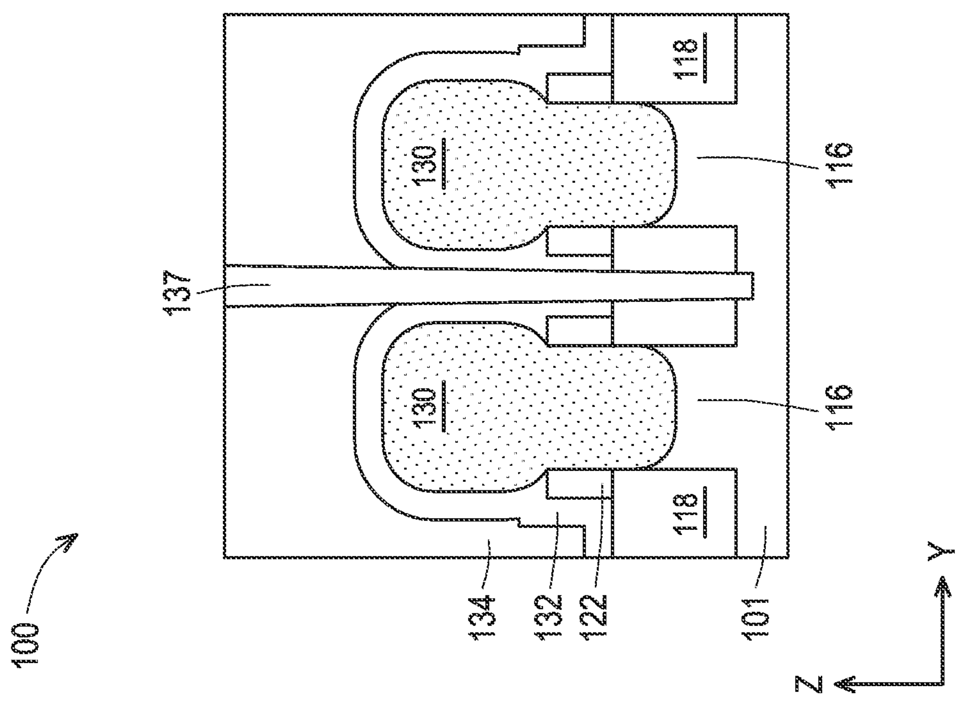

As shown in FIGS. 12A and 12B, a cut metal gate (CMG) process is performed. In some embodiments, an opening is formed in the gate electrode 136 and the gate dielectric layer 131, and a dielectric material 137 is formed in the opening. The opening may extend through the isolation region 118, and the dielectric material 137 extends through the isolation region 118, as shown in FIG. 12B. In some embodiments, the opening extends to the S/D regions, such as between the S/D regions 130, and the dielectric material 137 is also formed between adjacent S/D regions 130, as shown in FIG. 12A. The dielectric material 137 separates the gate electrode 136 into two portions, and the portions may be controlled independently. Portions of the dielectric material 137 may be formed on the gate electrode 136 and the ILD layer 134, and a planarization process, such as a CMP process, may be performed to remove the portions of the dielectric material 137 formed on the gate electrode 136 and the ILD layer 134.

Figure 13B:
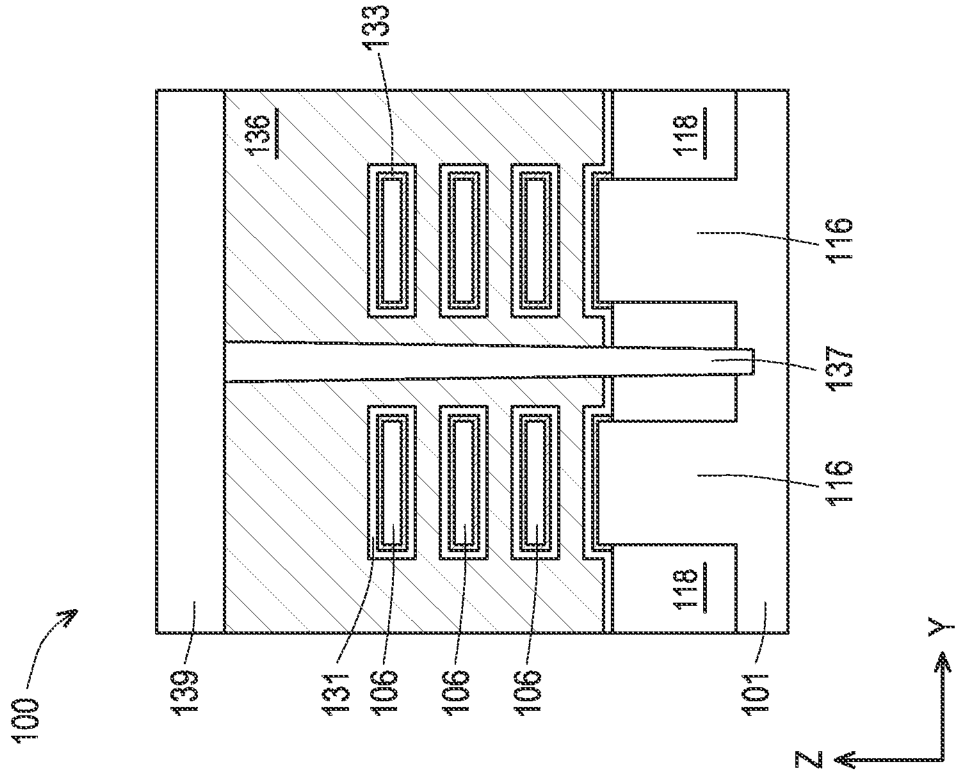
Figure 13A:
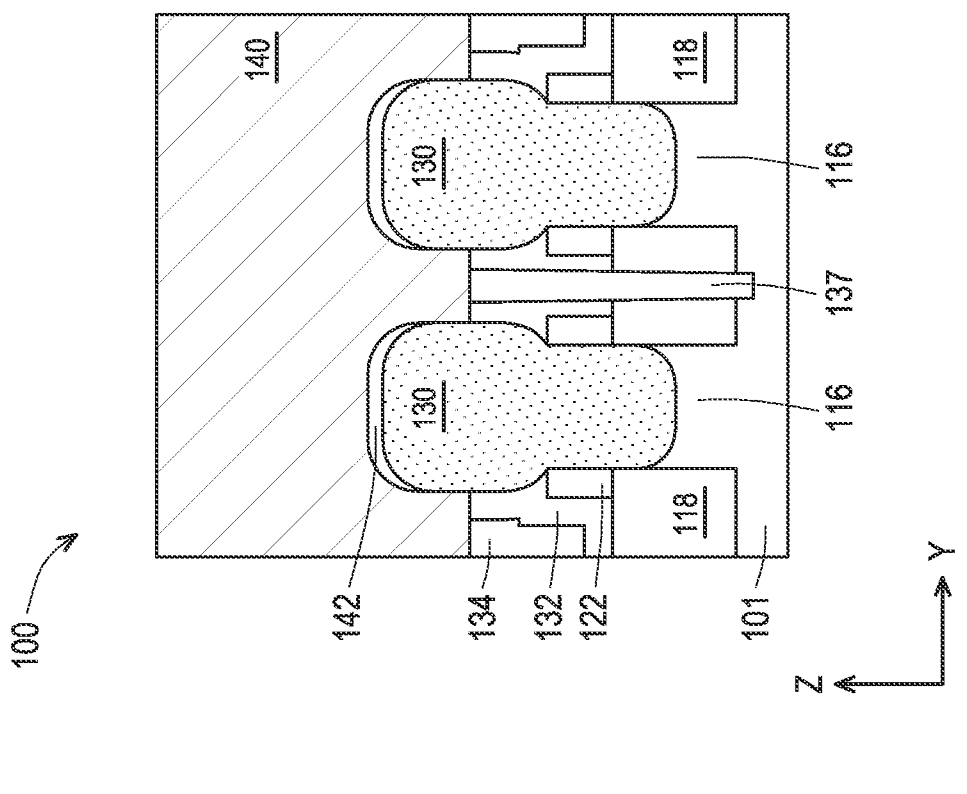

Next, as shown in FIGS. 13A and 13B, another ILD layer 139 is formed on the gate electrode 136, the dielectric material 137, and the ILD layer 134. The ILD layer 139 may include the same material as the ILD layer 134 and may be formed by the same process as the ILD layer 134. Conductive contacts 140 are formed in the ILD layer 139. In some embodiments, portions of the ILD layer 139, the ILD layer 134, and the CESL 132 are removed, and the conductive contacts 140 are formed over the S/D regions 130, as shown in FIG. 13A. The conductive contact 140 may be electrically conductive and may include a material having one or more of Ru, Mo, Co, Ni. W, Ti, Ta, Cu, Al, TiN or TaN, and the conductive contact 140 may be formed by any suitable method, such as electro-chemical plating (ECP), or PVD. A silicide layer 142 may be disposed between the conductive contact 140 and the S/D region 130, as shown in FIG. 13A. The silicide layer 142 may include a material having one or more of WSi, CoSi, NiSi, TiSi, MoSi and TaSi.

Figure 14:
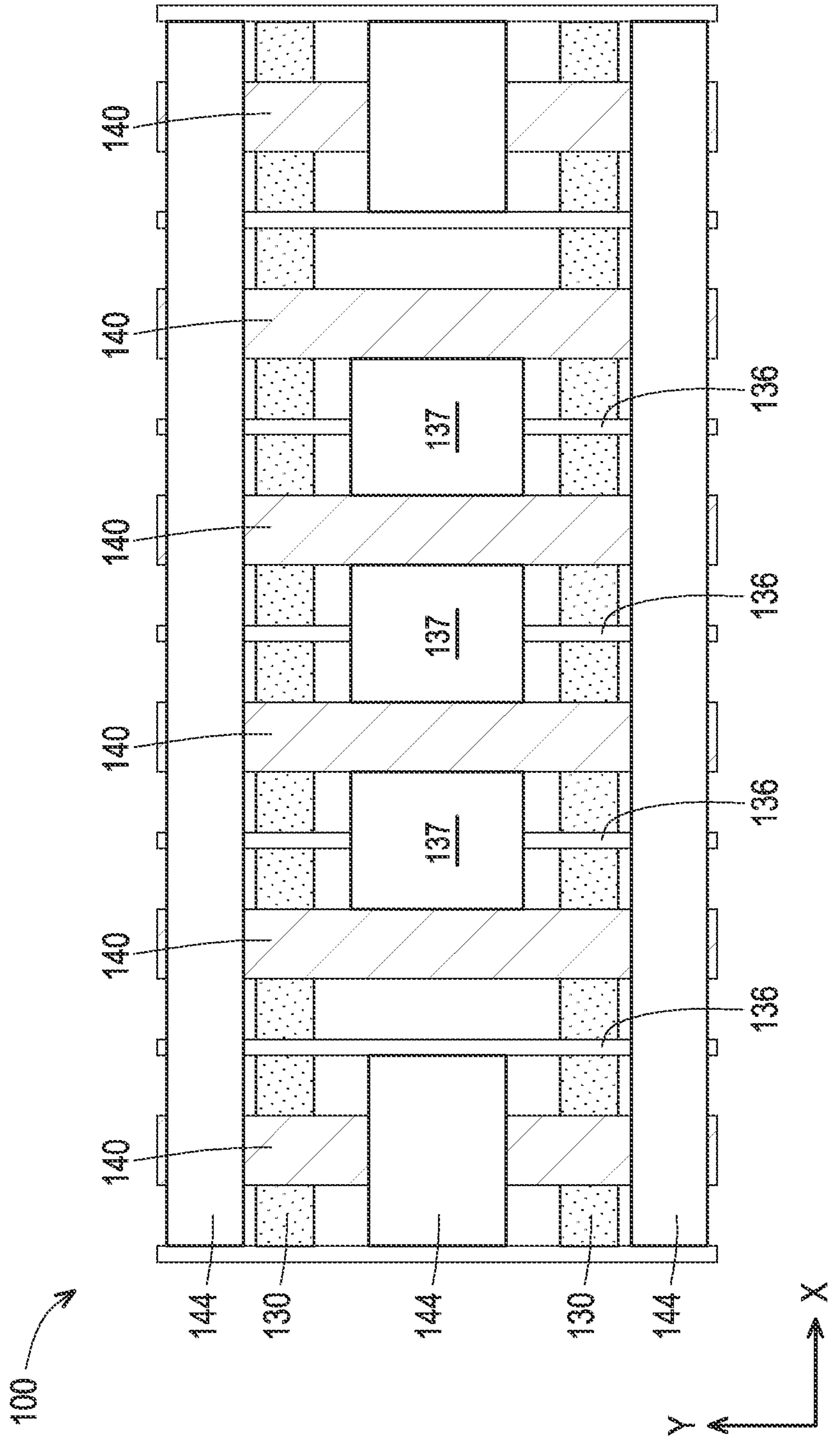
FIGS. 14 and 15 are top views of various stages of manufacturing the semiconductor device structure, in accordance with some embodiments.
Figure 15:
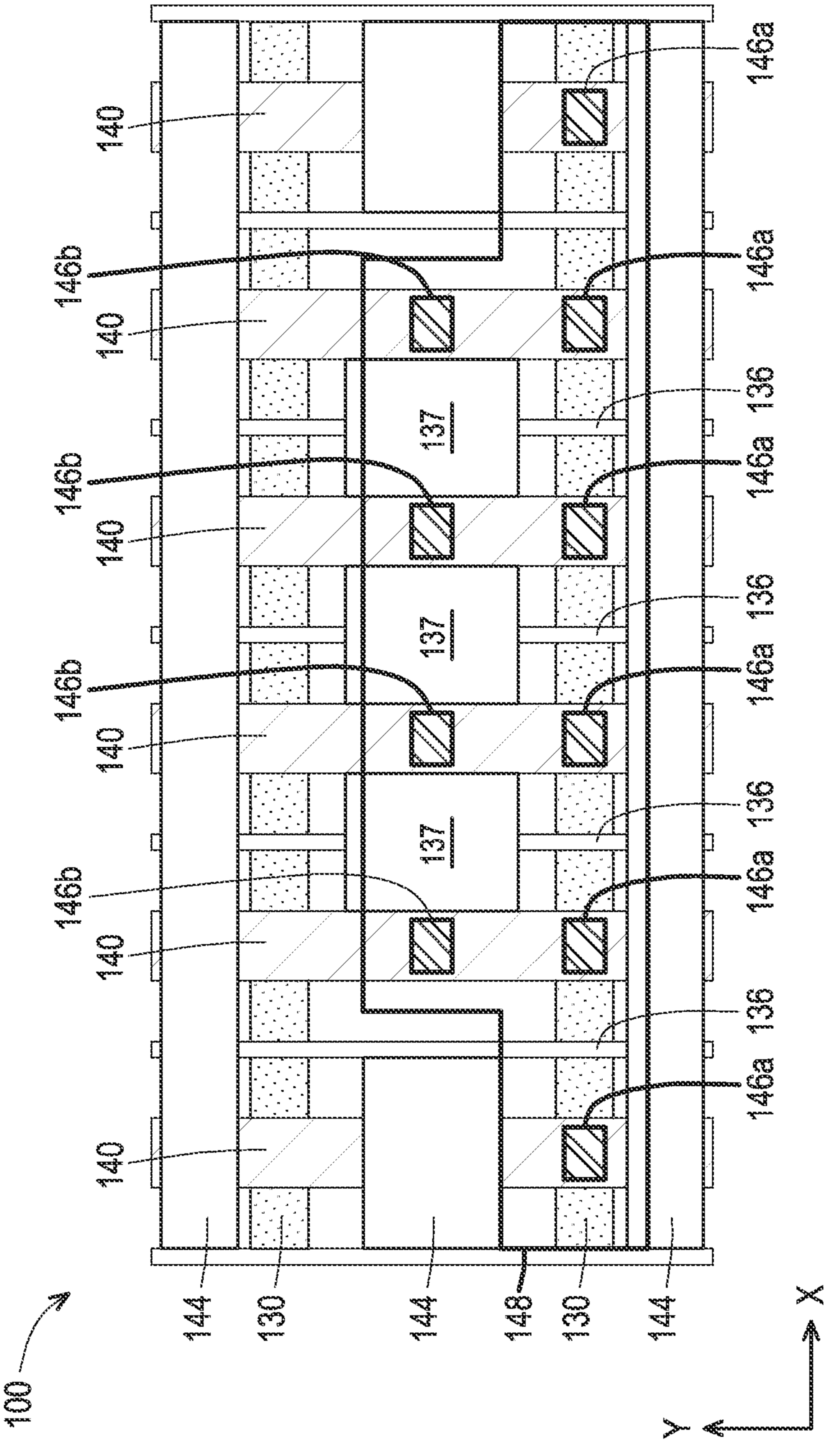

FIGS. 14 and 15 are top views of various stages of manufacturing the semiconductor device structure 100, in accordance with some embodiments. FIG. 14 is the top view of the semiconductor device structure 100 shown in FIGS. 13A and 13B. As shown in FIG. 14, the semiconductor device structure 100 includes a plurality of conductive contacts 140 extending along the Y-direction and traverse with respect to the fin structures 112 (or the S/D regions 130 and the first semiconductor layers 106). In some embodiments, multiple conductive contacts 140 are disposed over and in contact with the dielectric material 137. Each conductive contact 140 that is in contact with the dielectric material 137 is disposed over at least two S/D regions 130, as shown in FIG. 14. In some embodiments, the conductive contact 140 is in contact with at least two S/D regions 130. The conductive contacts 140 may be separated by the dielectric material 144. In some embodiments, the dielectric material 144 is part of the ILD layer 139. For example, the ILD layer 139 may be patterned to form a plurality of openings, and the conductive contacts 140 are formed in the openings. The remaining ILD layer 139 is the dielectric material 144.

Next, as shown in FIG. 15, a plurality of conductive features 146*a*, 146*b* are formed over the plurality of conductive contacts 140. The conductive features 146*a*, 146*b* are formed in a dielectric material, such as an intermetal dielectric (IMD) layer, which is part of an interconnect structure. The IMD layer is made from a dielectric material, such as $SiO_x$, $SiO_xC_yH_z$, or $SiO_xC_y$, where x, y and z are integers or non-integers. In some embodiments, the IMD layer includes a dielectric material having a k value ranging from about 1 to about 5. The conductive features 146*a*, 146*b* may be conductive vias. In some embodiments, the conductive features 146*a* are formed over the S/D regions 130, and the conductive features 146*b* are formed over the dielectric material 137, as shown in FIG. 15. Next, a conductive feature 148 is formed over the conductive features 146*a*, 146*b* and is electrically connected to the conductive features 146*a*, 146*b*. The conductive feature 148 is a conductive line having different height in the Y-direction, as shown in FIG. 15. The conductive features 146*a*, 146*b*, 148 are made from copper, aluminum, aluminum copper alloy, titanium, titanium nitride, tantalum, tantalum nitride, titanium silicon nitride, zirconium, gold, silver, cobalt, nickel, tungsten, tungsten nitride, tungsten silicon nitride, platinum, chromium, molybdenum, hafnium, other suitable conductive material, or a combination thereof. The conductive features 146*a*, 146*b*, 148 are formed in the interconnect structure by any suitable process, such as PVD, CVD, or ECP.

After completing the interconnect structure, which includes multiple layers of conductive features, such as conductive vias and conductive lines, embedded in the IMD layer, the semiconductor device structure 100 is flipped over for backside processing.

Figure 16A:
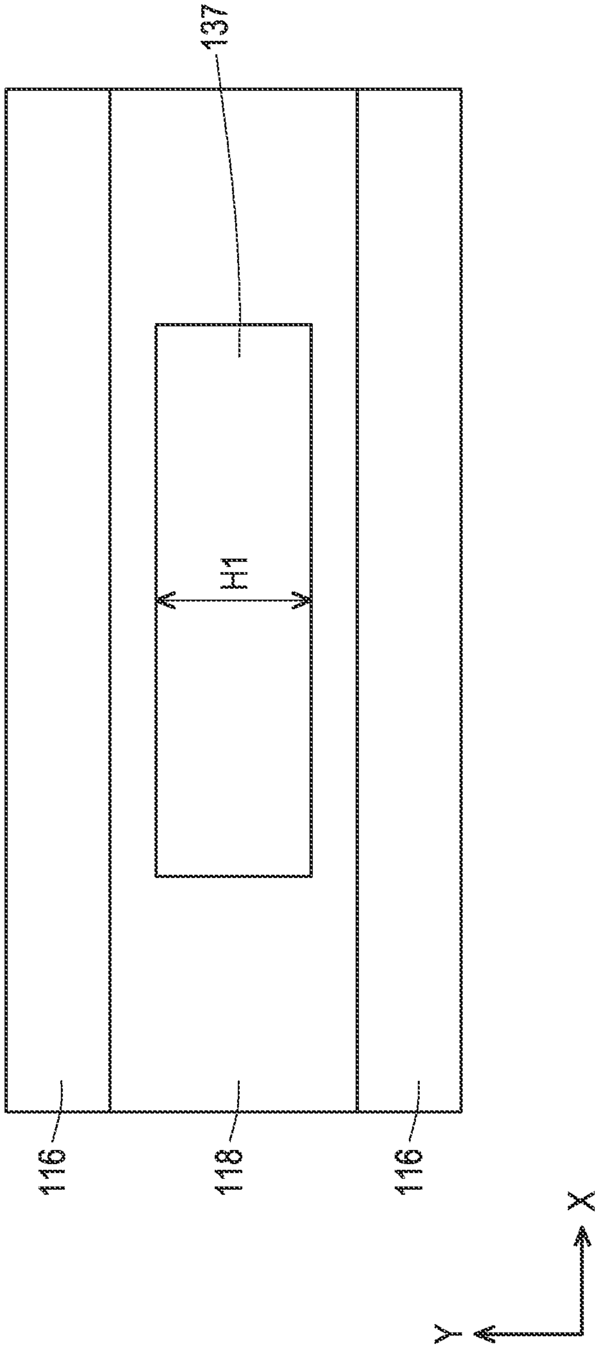
Figure 16C:
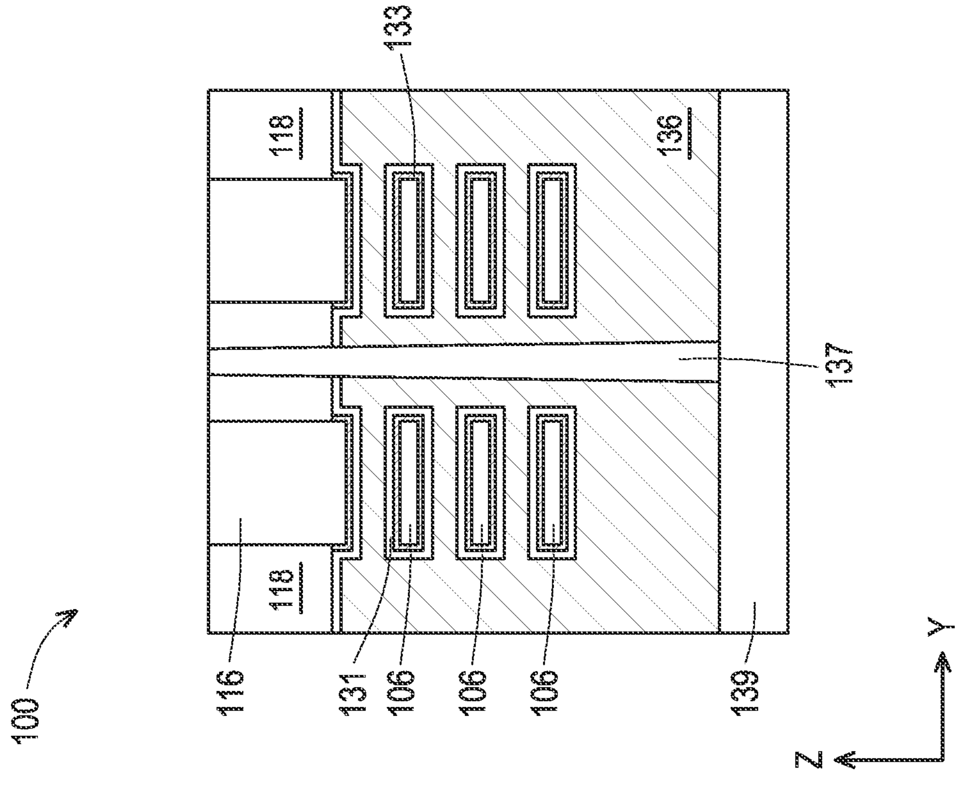
Figure 16B:
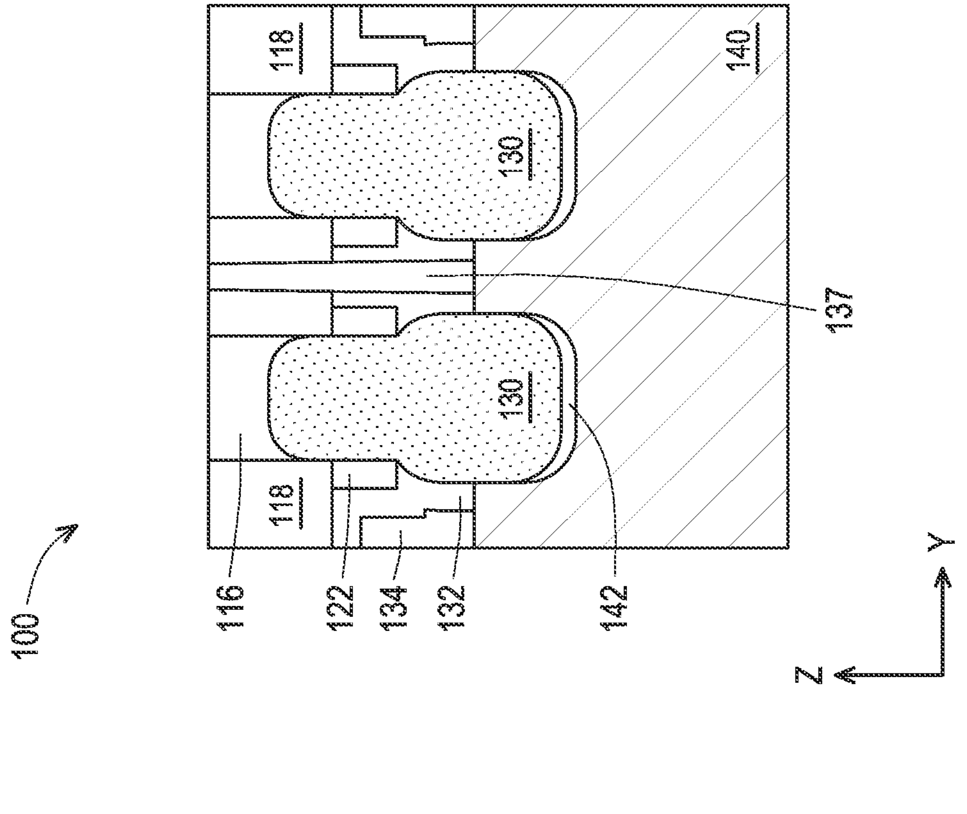

FIGS. 16A-19A are top views of various stages of manufacturing the semiconductor device structure 100 after the semiconductor device structure 100 is flipped over, in accordance with some embodiments. FIGS. 16B-19B are cross-sectional side views of various stages of manufacturing the semiconductor device structure 100 taken along line A-A of FIG. 1, in accordance with some embodiments. FIGS. 16C-19C are cross-sectional side views of various stages of manufacturing the semiconductor device structure 100 taken along line C-C of FIG. 8B, in accordance with some embodiments. The interconnect structure formed on the semiconductor device structure 100 is omitted for clarity in the above-mentioned figures. As shown in FIGS. 16A, 16B, 16C, the substrate 101 is thinned down, and the isolation regions 118, the well portion 116, and the dielectric material 137 are exposed. The thinning down of the substrate 101 may be by any suitable process. In some embodiments, a planarization process, such as a CMP process, is performed to thin down the substrate 101. As shown in FIG. 16A, the dielectric material 137 has a height H1 in the Y-direction.

Figure 17A:
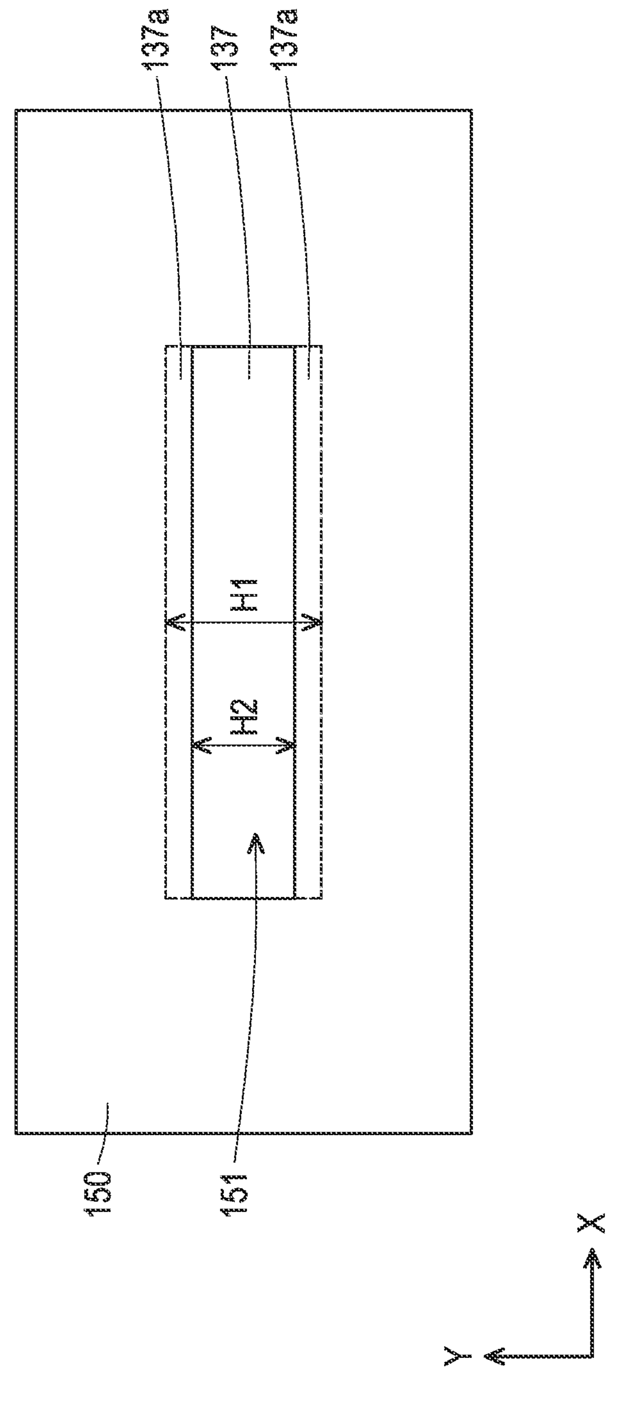
Figure 17C:
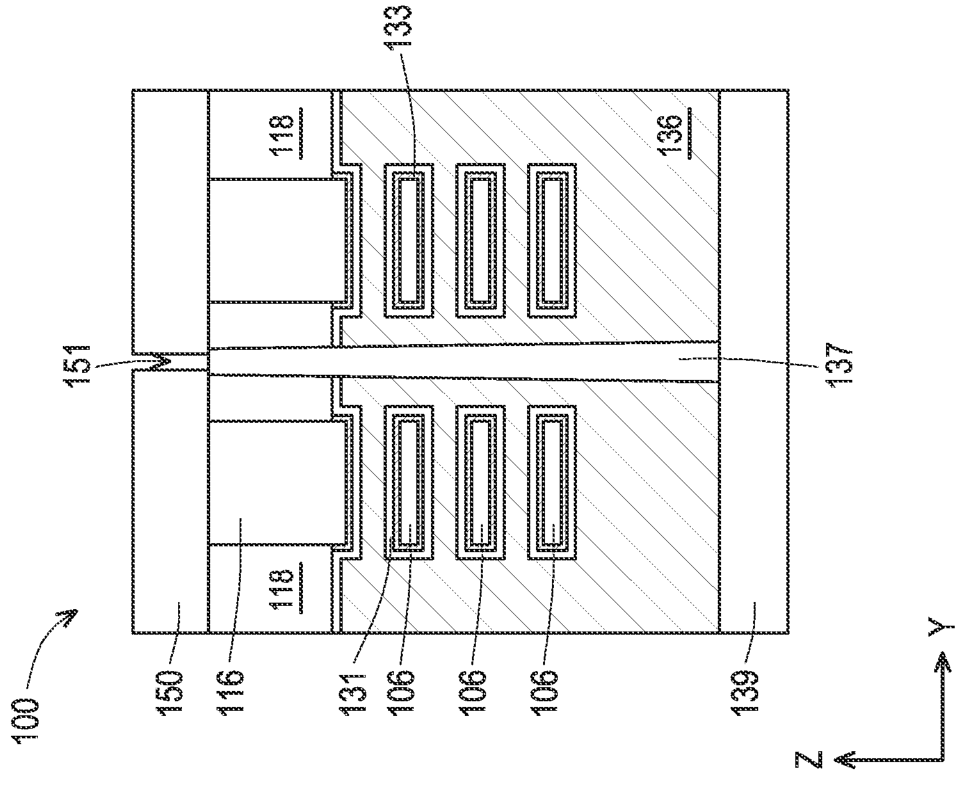
Figure 17B:
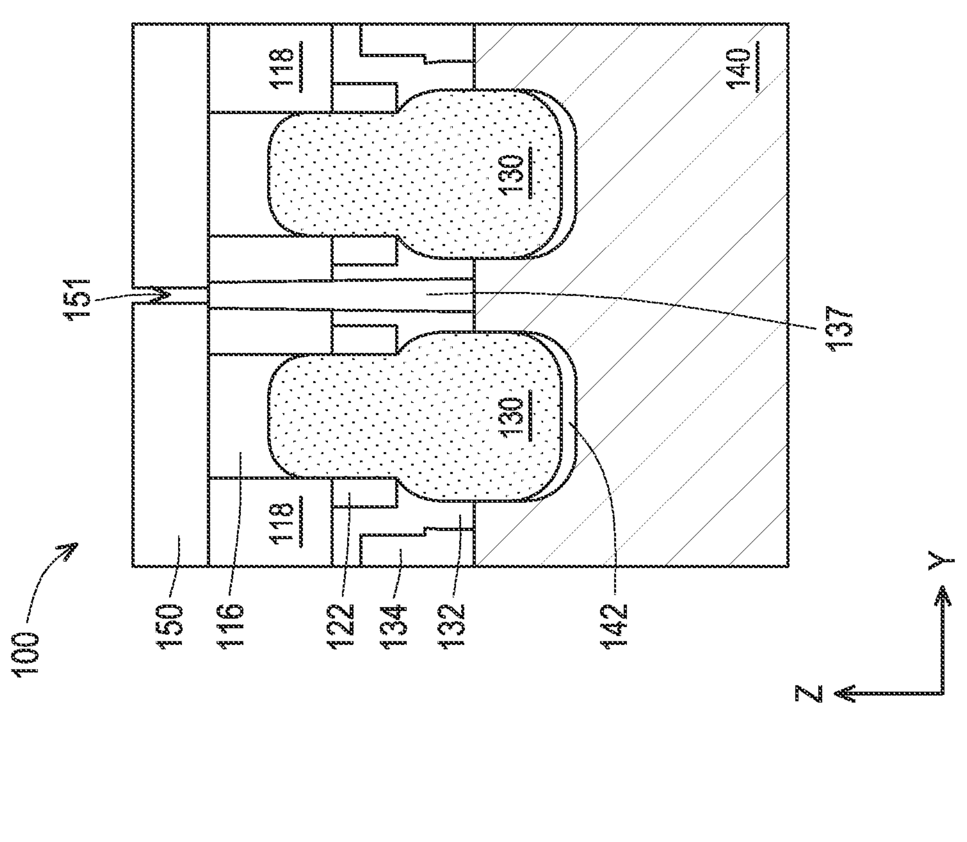

Next, as shown in FIGS. 17A, 17B, 17C, a mask layer 150 is formed on the well portions 116 and the isolation regions 118, and an opening 151 is formed in the mask layer 150 to expose a portion of the dielectric material 137. The mask layer 150 may include any suitable material, such as an oxide or a nitride. The opening 151 may be formed by any suitable process. In some embodiments, the opening 151 is formed by a dry etch process. A photoresist (not shown) may be formed on the mask layer 150 to expose a portion of the mask layer 150, and the exposed portion of the mask layer 150 is removed to form the opening 151. As shown in FIG. 17A, the opening 151 has a height H2 substantially less than the height H1 of the dielectric material 137. Portions 137*a* of the dielectric material 137 located above and below (along the Y-direction) the opening 151 are covered by the mask layer 150.

Figure 18A:
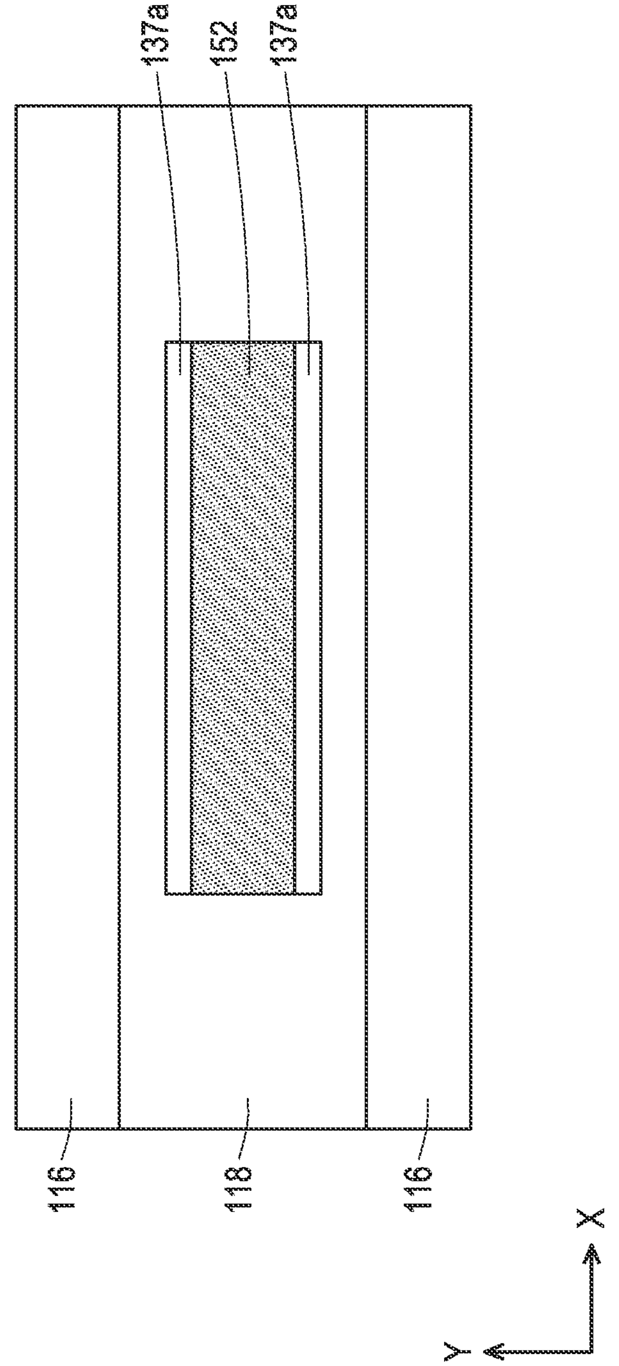
Figure 18C:
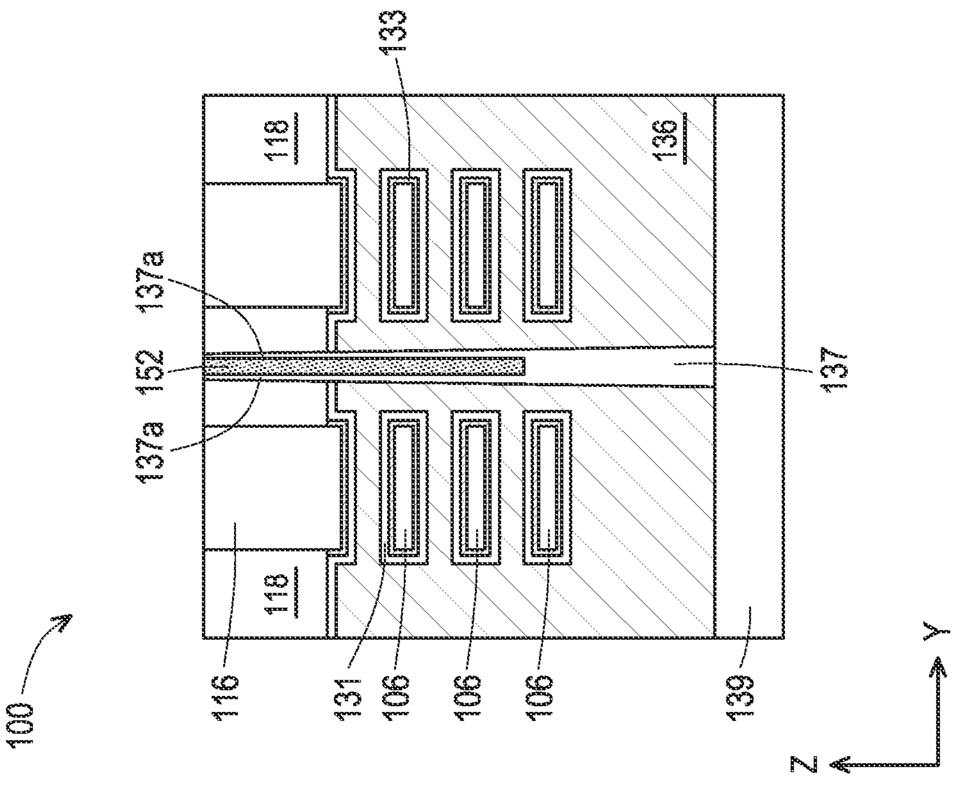
Figure 18B:
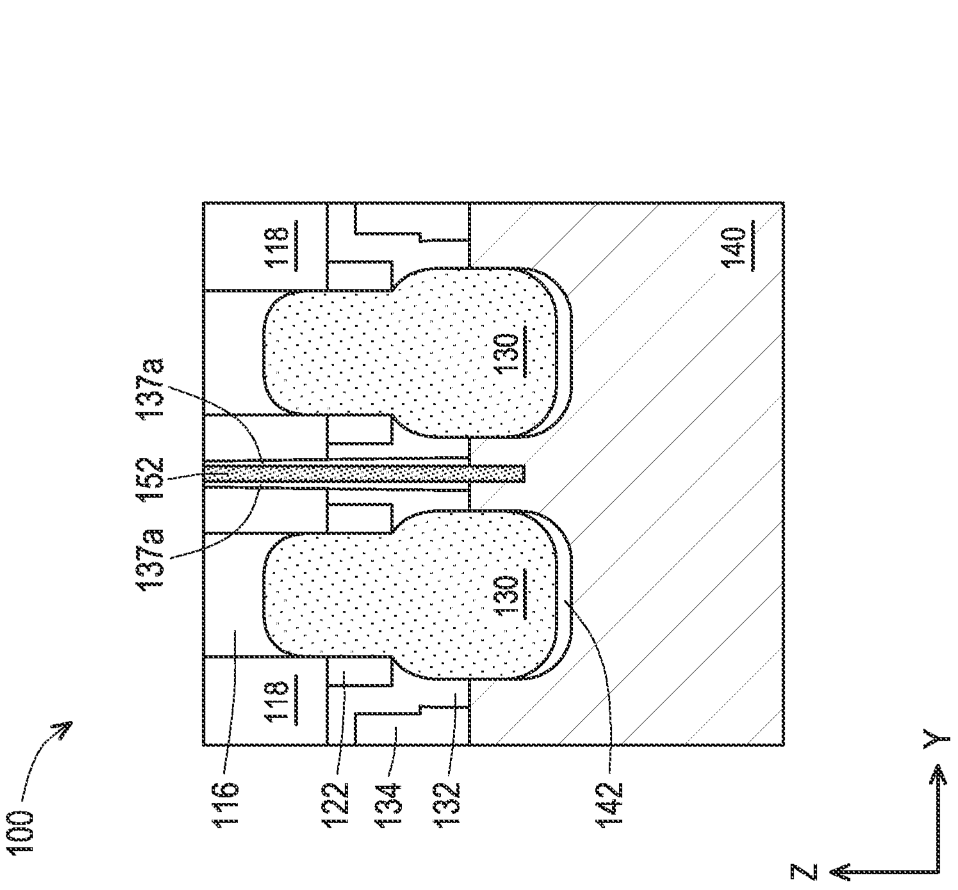

Next, the opening 151 is extended into the dielectric material 137, and a conductive feature 152 is formed in the opening 151, as shown in FIGS. 18A, 18B, 18C. The conductive feature 152 may include the same material as the conductive features 146*a*, 146*b*, 148 and may be formed by the same process as the conductive features 146*a*, 146*b*, 148. In some embodiments, as shown in FIG. 18B, the opening 151 is extended into the conductive contact 140 in the S/D region, and the conductive feature 152 extends into the conductive contact 140. Thus, the conductive contact 140 and the conductive feature 152 are electrically connected. In the channel region, as shown in FIG. 18C, the conductive feature 152 is electrically isolated from the gate electrode 136 by the portions 137*a* of the dielectric material 137. The conductive feature 152 may be also formed on the mask layer 150. A planarization process, such as a CMP process, may be performed to remove the portion of the conductive feature 152 formed on the mask layer 150. The planarization process may also remove the mask layer 150, and the conductive feature 152, the portions 137*a* of the dielectric material 137, the isolation regions 118, and the well portions 116 are exposed, as shown in FIGS. 18A, 18B, 18C.

Figure 19A:
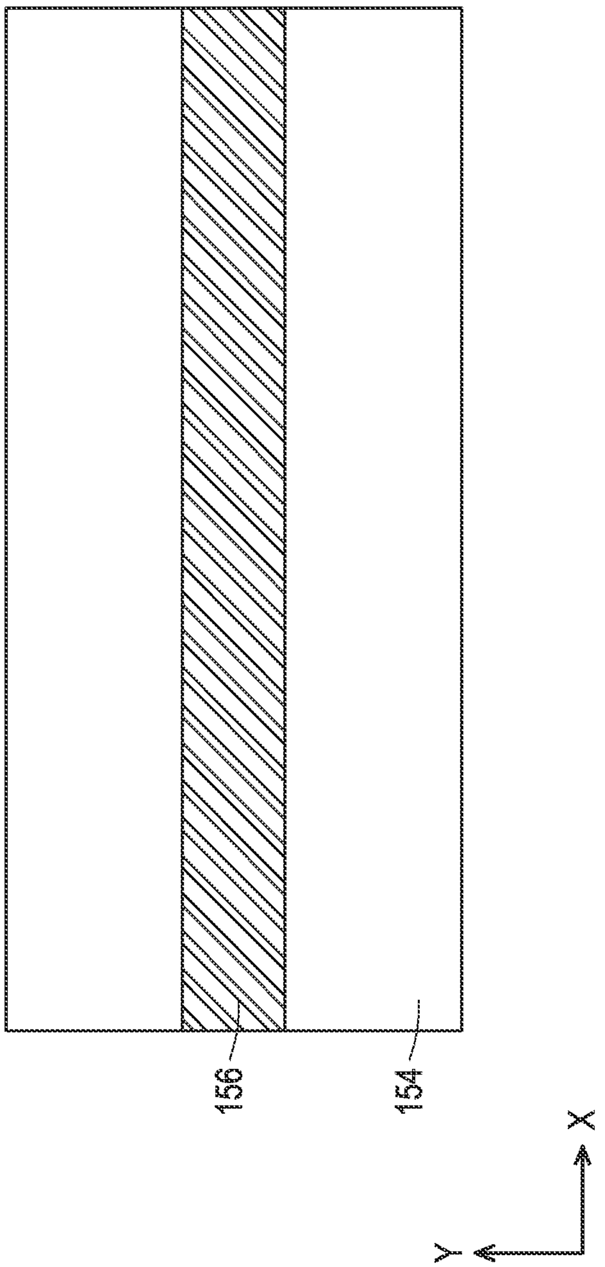
Figure 19B:
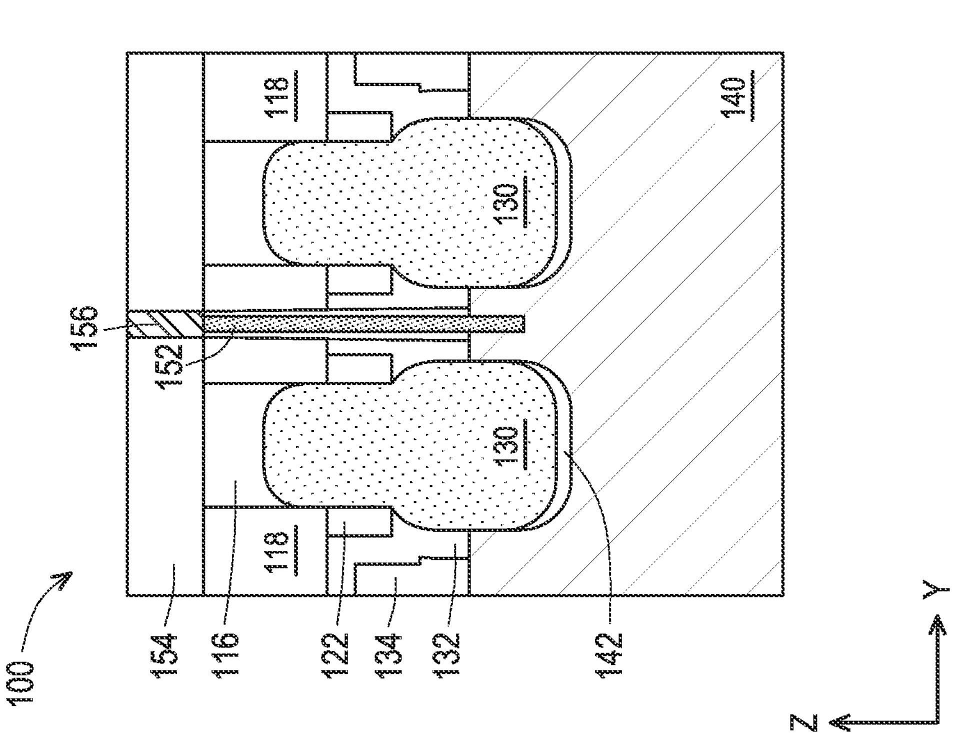
Figure 19C:
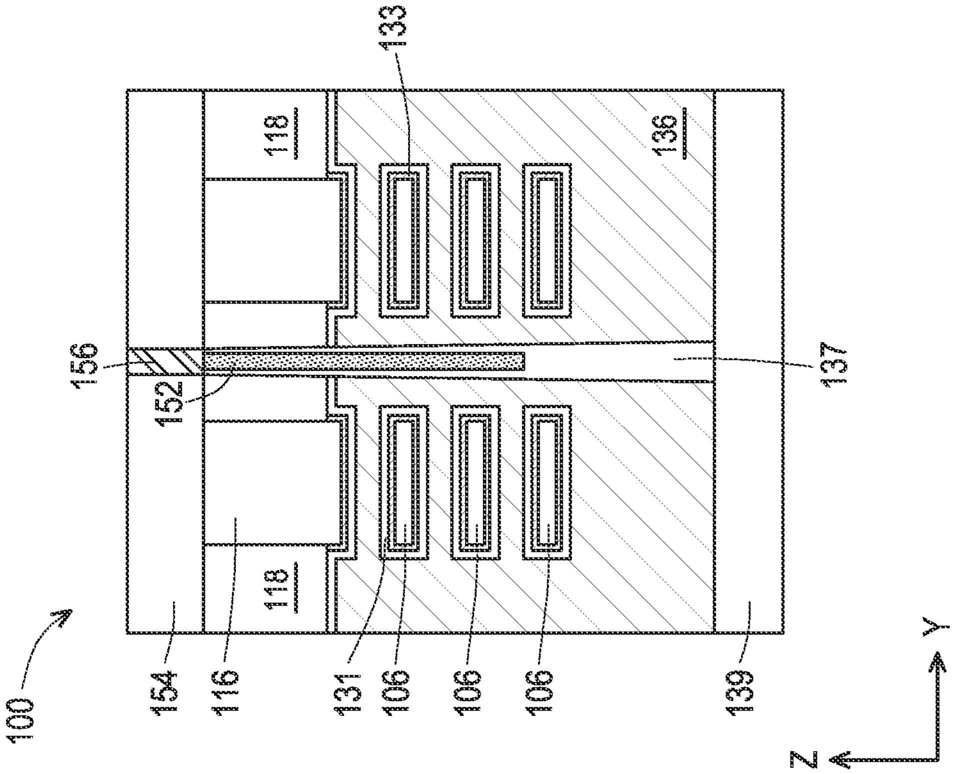

Next, as shown in FIG. 19A, 19B, 19C, a dielectric layer 154 is formed on the conductive feature 152, the portions 137*a* of the dielectric material 137, the isolation regions 118, and a conductive feature 156 is formed in the dielectric layer 154. The dielectric layer 154 and the conductive feature 156 may be part of an interconnect structure disposed on the backside of the semiconductor device structure 100. The dielectric layer 154 may include the same material as the IMD layer, and the conductive feature 156 may include the same material as the conductive features 146*a*, 146*b*, 148. As shown in FIG. 19B, the conductive feature 156 is electrically connected to the conductive contacts 140 by the conductive feature 152, and the conductive contacts 140 are electrically connected to the S/D regions 130. Thus, power or signal may be provided to the S/D regions 130 from the conductive feature 156 located on the backside of the semiconductor device structure 100 via the conductive feature 152. As a result, metal routing efficiency is improved.

Figure 20A:
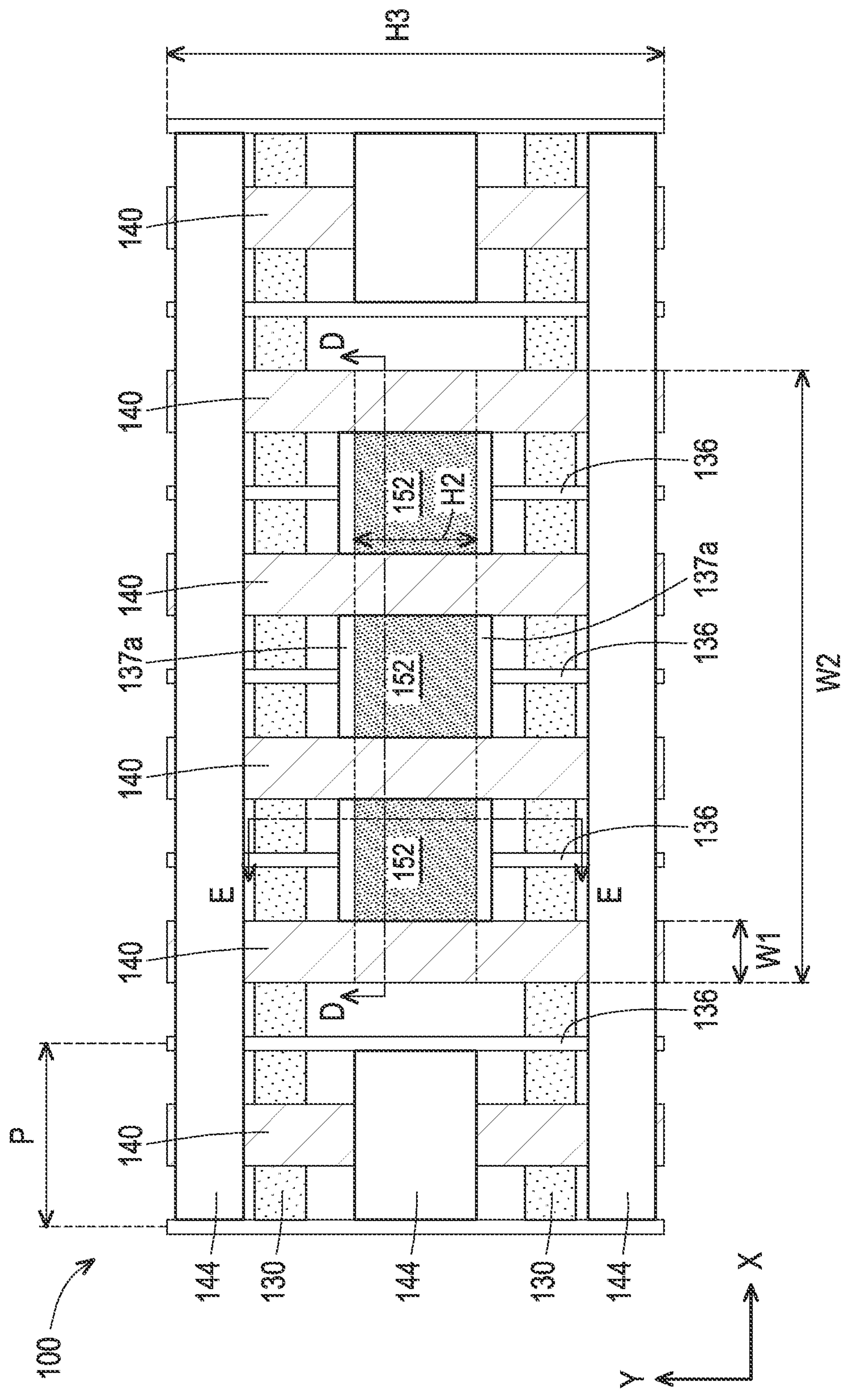
FIGS. 20A-20C are various views of the semiconductor device structure, in accordance with some embodiments.
Figure 20C:
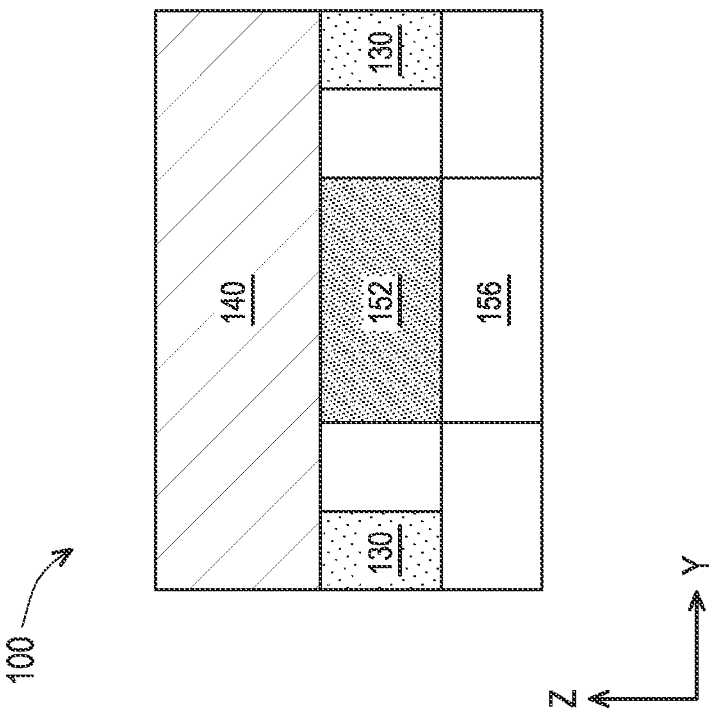
Figure 20B:
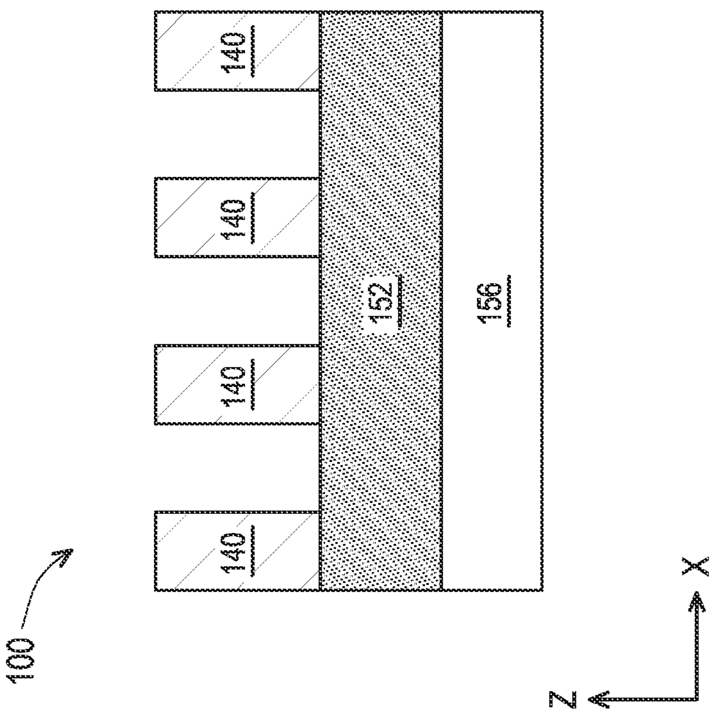

FIGS. 20A-20C are various views of the semiconductor device structure 100, in accordance with some embodiments. FIG. 20A is a top view of the semiconductor device structure 100 shown in FIG. 14 after the formation of the conductive feature 152. FIG. 20B is a cross-sectional side view of the semiconductor device structure 100 taken along line D-D of FIG. 20A. FIG. 20C is a cross-sectional side view of the semiconductor device structure 100 taken along line E-E of FIG. 20A. As shown in FIG. 20A, the semiconductor device structure 100 shown may be a standard logic (STD) cell and has a gate pitch P. In some embodiments, the cell height H3 may equal to 2P or 5P, the height H2 of the conductive feature 152 may equal to P to about 3P, the width W2 of the conductive feature 152 may equal to 1.5P to about 18P, and the width W1 of the conductive contact 140 may equal to 0.3P to about 0.5P. By having the conductive contacts 140 (0.3P to 0.5P) connecting the conductive feature 152 (1.5P to 18P) in a small cell, the conductive contacts 140 can be continuous (connecting two or more S/D regions 130). The continuous conductive contacts 140 solves the area penalty by inserting the conductive feature 152 directly into the STD cell without enlarging cell height.

As shown in FIG. 20A, a first plurality of S/D regions 130 are disposed along the X-direction, and a second plurality of S/D regions 130 are disposed along the X-direction. The first and second pluralities of S/D regions 130 are spaced apart in the Y-direction. The conductive feature 152 is disposed between the first and second pluralities of S/D regions 130. The plurality of conductive contacts 140 are disposed spaced apart along the X-direction.

As shown in FIGS. 20B and 20C, the plurality of conductive contacts 140 are in contact with the conductive feature 152, which is in contact with the conductive feature 156. Each conductive contact 140 is in contact with two or more S/D regions 130. The conductive feature 152 is electrically isolated from the S/D regions 130 and the gate electrode 136 (FIG. 19C) by the dielectric material 137 (FIGS. 19B, 19C).

Embodiments of the present disclosure provide a semiconductor device structure and methods of forming the same. In some embodiments, the semiconductor device structure includes a conductive feature 152 disposed between the S/D regions 130 and the gate electrode 136. The conductive feature 152 is electrically connected to a plurality of continuous conductive contacts 140, and each conductive contact 140 is electrically connected to two or more S/D regions 130. Some embodiments may achieve advantages. For example, by inserting the conductive feature 152 between the adjacent S/D regions 130, the cell height is not enlarged. Furthermore, with the continuous conductive contacts 140, process risk is lowered.

An embodiment is a semiconductor device structure. The structure includes a first plurality of source/drain regions disposed along a first direction, a second plurality of source/drain regions disposed along the first direction and spaced apart from the first plurality of source/drain regions, a conductive feature disposed between the first and second pluralities of source/drain regions, and a plurality of conductive contacts disposed over and in contact with the conductive feature. Each conductive contact of the plurality of conductive contacts is in contact with a source/drain region of the first plurality of source/drain regions and a source/drain region of the second plurality of source/drain regions.

Another embodiment is a semiconductor device structure. The structure includes a first gate electrode, a second gate electrode, and a dielectric material. The first gate electrode is separated to first and second portions by the dielectric material, and the second gate electrode is separated into third and fourth portions by the dielectric material. The structure further includes a first conductive feature disposed in the dielectric material and between the first and second portions of the first gate electrode and between the third and fourth portions of the second gate electrode, a first source/drain region disposed on a first side of the first portion of the first gate electrode, a second source/drain region disposed on a second side opposite the first side of the first portion of the first gate electrode, a third source/drain region disposed on a third side of the second portion of the first gate electrode, a fourth source/drain region disposed on a fourth side opposite the third side of the second portion of the first gate electrode, a first conductive contact disposed over and in electrical contact with the first conductive feature, the first source/drain region, and the third source/drain region, and a second conductive contact disposed over and in electrical contact with the first conductive feature, the second source/drain region, and the fourth source/drain region.

A further embodiment is a method for forming a semiconductor device structure. The method includes forming a sacrificial gate electrode over a portion of a first stack of semiconductor layers and a portion of a second stack of semiconductor layers, recessing exposed portions of the first and second stacks of semiconductor layers not covered by the sacrificial gate electrode to expose first and second well portions on opposite sides of the portion of the first stack of semiconductor layers and to expose third and fourth well portions on opposite sides of the portion of the second stack of semiconductor layers, forming first, second, third, fourth source/drain regions on the first, second, third, fourth well portions, respectively, replacing the sacrificial gate electrode with a gate electrode, and forming a dielectric material between the first and third source/drain regions. The dielectric material separates the gate electrode into two portions. The method further includes forming a first conductive contact over the first and third source/drain regions, and the first conductive contact is in contact with the dielectric material. The method further includes forming a second conductive contact over the second and fourth source/drain regions, and the second conductive contact is in contact with the dielectric material. The method further includes flipping over the semiconductor device structure and forming a first conductive feature in the dielectric material. The first conductive feature is electrically connected to the first and second conductive contacts.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device structure, comprising:

a first plurality of source/drain regions disposed along a first direction;

a second plurality of source/drain regions disposed along the first direction and spaced apart from the first plurality of source/drain regions;

a conductive feature disposed between the first and second pluralities of source/drain regions; and a plurality of conductive contacts disposed over and in electrical contact with the conductive feature, wherein at least one conductive contact of the plurality of conductive contacts is disposed over and in electrical contact with a source/drain region of the first plurality of source/drain regions and a source/drain region of the second plurality of source/drain regions.

2. The semiconductor device structure of claim 1, further comprising a dielectric material disposed between the first and second pluralities of source/drain regions, wherein the conductive feature is disposed in the dielectric material.

3. The semiconductor device structure of claim 2, wherein the dielectric material has a first height in a top view, and the conductive feature has a second height substantially less than the first height in the top view.

4. The semiconductor device structure of claim 2, further comprising a first gate electrode disposed between adjacent source/drain regions of the first plurality of source/drain regions and a second gate electrode disposed between adjacent source/drain regions of the second plurality of source/drain regions.

5. The semiconductor device structure of claim 4, wherein the dielectric material is disposed between the first and second gate electrodes.

6. The semiconductor device structure of claim 5, wherein the conductive feature is disposed between the first and second gate electrodes.

7. A semiconductor device structure, comprising:

a first gate electrode and a second gate electrode;

a dielectric material, wherein the first gate electrode is separated into first and second portions by the dielectric material, and the second gate electrode is separated into third and fourth portions by the dielectric material;

a first conductive feature disposed in the dielectric material and between the first and second portions of the first gate electrode and between the third and fourth portions of the second gate electrode;

a first source/drain region disposed on a first side of the first portion of the first gate electrode;

a second source/drain region disposed on a second side opposite the first side of the first portion of the first gate electrode;

a third source/drain region disposed on a third side of the second portion of the first gate electrode;

a fourth source/drain region disposed on a fourth side opposite the third side of the second portion of the first gate electrode;

a first conductive contact disposed over and in electrical contact with the first conductive feature, the first source/drain region, and the third source/drain region; and a second conductive contact disposed over and in electrical contact with the first conductive feature, the second source/drain region, and the fourth source/drain region.

8. The semiconductor device structure of claim 7, further comprising a plurality of second conductive features disposed on the first and second conductive contacts.

9. The semiconductor device structure of claim 8, further comprising a third conductive feature disposed on the plurality of second conductive features, wherein the third conductive feature has varying heights in a top view.

10. The semiconductor device structure of claim 8, further comprising a fourth conductive feature disposed below the first conductive feature, wherein the first, second, third, and fourth conductive features are electrically connected.

11. The semiconductor device structure of claim 7, wherein the dielectric material and the first conductive feature are disposed between the first and third source/drain regions and between the second and fourth source/drain regions.

12. The semiconductor device structure of claim 7, further comprising a first plurality of semiconductor layers disposed between the first and second source/drain regions and a second plurality of semiconductor layers disposed between the third and fourth source/drain regions.

13. The semiconductor device structure of claim 12, wherein the first portion of the first gate electrode surrounds the first plurality of semiconductor layers, and the second portion of the first gate electrode surrounds the second plurality of semiconductor layers.

14. A method for forming a semiconductor device structure, comprising:

forming a sacrificial gate electrode over a portion of a first stack of semiconductor layers and a portion of a second stack of semiconductor layers;

recessing exposed portions of the first and second stacks of semiconductor layers not covered by the sacrificial gate electrode to expose first and second well portions on opposite sides of the portion of the first stack of semiconductor layers and to expose third and fourth well portions on opposite sides of the portion of the second stack of semiconductor layers;

forming first, second, third, fourth source/drain regions on the first, second, third, fourth well portions, respectively;

replacing the sacrificial gate electrode with a gate electrode;

forming a dielectric material between the first and third source/drain regions, wherein the dielectric material separates the gate electrode into two portions;

forming a first conductive contact over the first and third source/drain regions, wherein the first conductive contact is in contact with the dielectric material;

forming a second conductive contact over the second and fourth source/drain regions, wherein the second conductive contact is in contact with the dielectric material;

flipping over the semiconductor device structure; and forming a first conductive feature in the dielectric material, wherein the first conductive feature is electrically connected to the first and second conductive contacts.

15. The method of claim 14, wherein forming the dielectric material comprises forming an opening in the gate electrode and an isolation region located below the gate electrode and filling the opening with the dielectric material.

16. The method of claim 15, further comprising removing portions of the dielectric material located between the first and third source/drain regions and between the second and fourth source/drain regions prior to forming the first and second conductive contacts.

17. The method of claim 14, wherein forming the first conductive feature comprises:

removing a portion of a substrate to expose the dielectric material;

depositing a mask layer on the dielectric material;

forming an opening in the mask layer to expose a first portion of the dielectric material, wherein a second portion of the dielectric material is covered by the mask layer;

extending the opening into the dielectric material; and filling the opening with the first conductive feature.

18. The method of claim 17, wherein the opening is extended into the first conductive contact, and the first conductive feature is formed in the first conductive contact.

19. The method of claim 18, further comprising forming a dielectric layer on the first conductive feature and the dielectric material.

20. The method of claim 19, further comprising forming a second conductive feature in the dielectric layer, wherein the second conductive feature is electrically connected to the first conductive feature.

* * * * *